(12) United States Patent
Gao et al.

(10) Patent No.: US 11,165,609 B2
(45) Date of Patent: Nov. 2, 2021

(54) SIGNAL GENERATION APPARATUS AND METHOD, AND SYSTEM

(71) Applicant: HUAWEI TECHNOLOGIES CO., LTD., Shenzhen (CN)

(72) Inventors: Lei Gao, Dongguan (CN); Behzad Dehlaghi, Toronto (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/144,217

(22) Filed: Jan. 8, 2021

(65) Prior Publication Data

US 2021/0135906 A1 May 6, 2021

Related U.S. Application Data

(63) Continuation of application No. PCT/CN2018/095272, filed on Jul. 11, 2018.

(51) Int. Cl.
*H04L 25/02* (2006.01)
*H03F 3/45* (2006.01)
*H04L 25/03* (2006.01)
*H04L 25/14* (2006.01)

(52) U.S. Cl.
CPC ..... *H04L 25/0272* (2013.01); *H03F 3/45475* (2013.01); *H04L 25/03878* (2013.01); *H04L 25/14* (2013.01)

(58) Field of Classification Search
CPC ....... H04L 25/14; H04L 25/0272–0276; H04L 25/028; H04L 25/0284–0288; H04L 25/03878; H03F 3/45475
See application file for complete search history.

(56) References Cited

U.S. PATENT DOCUMENTS

| | | | | | |
|---|---|---|---|---|---|
| 5,166,956 | A | * | 11/1992 | Baltus | H04L 25/4917 341/56 |
| 5,621,901 | A | * | 4/1997 | Morriss | G06F 13/385 710/305 |
| 6,414,557 | B1 | * | 7/2002 | Liu | H03F 3/45183 327/261 |
| 6,664,811 | B1 | * | 12/2003 | Bridgewater, Jr. | H03K 17/164 326/26 |
| 6,836,185 | B1 | * | 12/2004 | Pobanz | G02F 1/0327 330/260 |

(Continued)

*Primary Examiner* — James M Perez
(74) *Attorney, Agent, or Firm* — Rimon PC

(57) ABSTRACT

This application provides a signal generation apparatus and method, and a system. The signal generation apparatus includes an encoder, a serializer, an equalizer, and N amplifiers. The encoder is configured to encode to-be-sent data, to obtain a first electrical signal. The serializer is configured to perform parallel-to-serial processing on the first electrical signal, to obtain a second electrical signal. The equalizer is configured to process the second electrical signal, to obtain a third electrical signal. The third electrical signal is amplified by the N amplifiers, to obtain N pairs of differential signals, where N is an integer greater than 2. In embodiments of this application, the N amplifiers amplify differential signals to obtain N pairs of differential signals, and the N pairs of differential signals are directly used as drive signals, so that power consumption for generating a drive signal can be reduced.

18 Claims, 20 Drawing Sheets

(56) References Cited

U.S. PATENT DOCUMENTS

| | | | |
|---|---|---|---|
| 7,061,283 B1* | 6/2006 | Ghia | H04L 25/0288 327/108 |
| 7,353,009 B2* | 4/2008 | Cheng | H04L 25/0272 327/147 |
| 7,471,285 B2* | 12/2008 | Cheng | H04L 25/0272 345/204 |
| 7,697,628 B2* | 4/2010 | Choi | H04L 25/085 375/288 |
| 7,822,111 B2* | 10/2010 | Sohn | H04L 25/03038 375/231 |
| 7,826,551 B2* | 11/2010 | Lee | H04L 25/0272 375/288 |
| 7,986,745 B2* | 7/2011 | Hosaka | H03M 7/06 375/288 |
| 8,064,535 B2* | 11/2011 | Wiley | H04L 25/4917 375/288 |
| 8,391,436 B2* | 3/2013 | Higeta | H03K 5/26 375/371 |
| 8,472,551 B2* | 6/2013 | Wiley | H04L 25/0298 375/288 |
| 8,675,714 B2* | 3/2014 | Cheung | H04B 3/466 375/214 |
| 8,699,616 B1* | 4/2014 | Hairapetian | H04L 25/4904 375/286 |
| 8,773,964 B2* | 7/2014 | Hsueh | H04B 1/7103 370/201 |
| 8,798,216 B2* | 8/2014 | Pullela | H04L 25/08 375/349 |
| 8,848,810 B2* | 9/2014 | Lee | H04L 25/0272 375/260 |
| 8,996,740 B2* | 3/2015 | Wiley | H04L 25/02 710/8 |
| 9,112,815 B2* | 8/2015 | Wiley | H04L 12/12 |
| 9,148,087 B1* | 9/2015 | Tajalli | H03G 3/3089 |
| 9,165,615 B2* | 10/2015 | Amirkhany | G11C 7/02 |
| 9,172,412 B2* | 10/2015 | Kim | H04B 15/00 |
| 9,231,790 B2* | 1/2016 | Wiley | H04L 5/20 |
| 9,288,082 B1* | 3/2016 | Ulrich | H04L 25/0294 |
| 9,288,089 B2* | 3/2016 | Cronie | H04L 25/4906 |
| 9,300,503 B1* | 3/2016 | Holden | H04L 25/028 |
| 9,306,609 B1* | 4/2016 | LaCroix | H04B 3/548 |
| 9,362,974 B2* | 6/2016 | Fox | G06F 13/4282 |
| 9,565,036 B2* | 2/2017 | Zerbe | G06F 1/10 |
| 9,602,317 B1* | 3/2017 | Hailu | H03F 3/45183 |
| 9,832,046 B2* | 11/2017 | Hormati | H04L 1/0057 |
| 9,838,017 B2* | 12/2017 | Fox | H03K 19/018521 |
| 9,838,234 B2* | 12/2017 | Holden | H04L 25/4919 |
| 9,985,745 B2* | 5/2018 | Shokrollahi | H04L 1/0054 |
| 10,038,575 B1* | 7/2018 | Steffan | H04L 27/01 |
| 10,055,372 B2* | 8/2018 | Shokrollahi | G06F 13/362 |
| 10,084,623 B1* | 9/2018 | Mactaggart | H04L 7/033 |
| 10,153,591 B2* | 12/2018 | Shokrollahi | H04L 25/4917 |
| 10,243,765 B2* | 3/2019 | Shokrollahi | H04L 25/0276 |
| 10,324,876 B2* | 6/2019 | Shokrollahi | G06F 13/362 |
| 10,333,741 B2* | 6/2019 | Shokrollahi | H04L 25/0276 |
| 10,333,749 B2* | 6/2019 | Shokrollahi | H04L 25/49 |
| 10,498,289 B2* | 12/2019 | Shu | H03B 5/1243 |
| 2002/0057101 A1* | 5/2002 | Tang | H04L 25/03878 326/29 |
| 2003/0201802 A1* | 10/2003 | Young | H04L 5/20 327/108 |
| 2004/0090254 A1* | 5/2004 | Owens | H03K 5/13 327/170 |
| 2004/0239374 A1* | 12/2004 | Hori | H03K 5/003 327/65 |
| 2006/0013331 A1* | 1/2006 | Choi | H04L 25/14 375/288 |
| 2006/0082403 A1* | 4/2006 | Kase | H03K 5/133 327/158 |
| 2006/0244505 A1* | 11/2006 | Fung | G06F 1/10 327/293 |
| 2008/0204171 A1* | 8/2008 | Abel | H03F 3/45183 333/214 |
| 2008/0266463 A1* | 10/2008 | Fensore | H03F 1/02 348/726 |
| 2014/0269881 A1* | 9/2014 | He | H04L 25/03878 375/231 |
| 2015/0222287 A1* | 8/2015 | Tekin | H03L 7/18 375/355 |
| 2015/0349853 A1* | 12/2015 | Bosenko | H04B 5/0031 455/41.2 |
| 2016/0283429 A1* | 9/2016 | Wagh | G06F 13/36 |
| 2016/0285456 A1* | 9/2016 | Fox | H01L 23/5384 |
| 2017/0257171 A1* | 9/2017 | Welch | H04L 25/0272 |
| 2019/0044768 A1* | 2/2019 | Kim | H04L 27/04 |
| 2020/0366535 A1* | 11/2020 | Yu | H04L 25/0212 |

* cited by examiner

SIGNAL GENERATION APPARATUS AND METHOD, AND SYSTEM

CROSS-REFERENCE TO RELATED APPLICATION

This application is a continuation of International Application No. PCT/CN2018/095272, filed on Jul. 11, 2018, the disclosure of which is hereby incorporated by reference in its entirety.

TECHNICAL FIELD

This application relates to the optical network field, and more specifically, to a signal generation apparatus and method, and a system.

BACKGROUND

With rapid development of data center technologies, optical modules are widely used in data centers. An increasing requirement for a board port capacity in the data centers is accompanied by increasing power consumption of the optical modules. In terms of power consumption of an optical module, power consumption of each component of the optical module needs to be considered first.

A serializer/deserializer (SerDes) is usually used on an electrical interface side of an optical module, to implement serial-to-parallel conversion of data. An internal data processing process on the transmitter side of the SerDes is roughly as follows: data parallel-to-serial conversion, equalization, and amplification and output.

In the prior art, the foregoing amplification and output process is implemented by using an amplifier unit. Because the SerDes is usually manufactured using a complementary metal oxide semiconductor (CMOS) process, the maximum swing of the amplification and output is usually about 1 V, which makes the SerDes not suitable to directly drive a modulator in the optical module. Therefore, a signal processed on the transmitter side of the SerDes needs to be sent to a separate driver chip for amplification, and then to a modulator that is driven to convert an electrical signal into an optical signal.

Because the signal processed on the transmitter side of the SerDes needs to be amplified by the driver chip, the power consumption of the driver is high. Consequently, the power consumption for generating a drive signal is very high. How to reduce power consumption used for generating a drive signal has become a problem that needs to be resolved urgently.

SUMMARY

This application provides a signal generation apparatus and method, a modulator, and a system, to reduce power consumption for generating a signal.

According to a first aspect, a signal generation apparatus is provided, including: an encoder, a serializer, an equalizer, and N amplifiers, where the encoder is configured to encode to-be-sent data, to obtain a first electrical signal; the serializer is configured to perform parallel-to-serial processing on the first electrical signal, to obtain a second electrical signal; and the equalizer is configured to process the second electrical signal, to obtain a third electrical signal. The third electrical signal is amplified by the N amplifiers, to obtain N pairs of differential signals, where N is an integer greater than 2.

According to the signal generation apparatus provided in this embodiment of this application, the N amplifiers are disposed, and differential signals are amplified by the N amplifiers and output, to obtain the N pairs of differential signals. The N pairs of differential signals are drive signals, and do not need to be amplified by a driver, so that power consumption for generating a signal can be reduced.

It should be understood that the first electrical signal and the second electrical signal may be differential signals or may not be differential signals, and a differential first electrical signal and a differential second electrical signal or a non-differential first electrical signal and a non-differential second electrical signal can be obtained based on different designs of an encoder and a serializer circuit.

It should be further understood that the third electrical signal is a differential signal. In other words, signals output by the equalizer are one positive signal and one negative signal. The positive signal and the negative signal pass through the N amplifiers, and each pair of differential signals of the N pairs of differential signals that are amplified and output also include one positive signal and one negative signal.

It should be understood that the positive signal and the negative signal are transmitted by using one positive cable and one negative cable.

With reference to the first aspect, in some implementations of the first aspect, a delayer is disposed at a signal input end of a first amplifier and/or a signal output end of the first amplifier, the delayer is configured to control a delay of a first pair of differential signals output by the first amplifier, and the first amplifier is any one of the N amplifiers.

According to the signal generation apparatus provided in this embodiment of this application, the delayer is disposed at the signal input end of the amplifier and/or the signal output end of the first amplifier, so that a problem of asynchronization between the differential signal output by the amplifier and an optical signal with a delay can be resolved, thereby increasing a bandwidth of a modulator.

It should be understood that a delay requirement of each pair of differential signals is based on a distance between a modulator driven by the differential signal and a differential signal output by the equalizer. A longer distance indicates a longer transmission delay of an optical signal and a longer delay that corresponds to the delayer disposed in the amplifier that outputs a differential signal driving the modulator.

With reference to the first aspect and the foregoing implementations of the first aspect, in another implementation of the first aspect, a delay of the delayer is $(M-1)*t$, where M indicates an $M^{th}$ modulator segment in X modulator segments driven by the first pair of differential signals, X is an integer greater than 1, M is a positive integer less than or equal to X, and t is a preset unit delay.

According to the signal generation apparatus provided in this embodiment of this application, modulation arms of different modulators are driven based on the differential signal output by the amplifier, to set the delay of the delayer, so that the differential signal passing through the delayer meets a delay requirement of the modulation arm driven by the differential signal.

According to a second aspect, a modulator is provided, including X modulator segments, where each modulator segment includes two modulation arms, and two modulation arms of at least one of the X modulator segments are respectively driven by two pairs of differential signals. The differential signal may be provided by the signal generation apparatus according to the first aspect.

The modulator provided in this embodiment of this application includes X modulator segments, and two modulation arms of at least one modulator segment are driven by two pairs of differential signals, so that a dual-arm dual-differential driving structure can be formed.

With reference to the second aspect, in some implementations of the second aspect, an electrode structure of the modulation arm includes an electrode structure of a drive apparatus; and an electrode structure of at least one of the X modulator segments is GSSGSSG.

According to the modulator provided in this embodiment of this application, the electrode structure of the modulation arm of the modulator is designed as GSSG, so that a single modulation arm can meet differential driving.

It should be understood that in this embodiment of this application, electrode structures of two modulation arms of at least one of the X modulator segments need to be electrode structures of GSSG. When electrode structures of two modulation arms of one modulator segment are GSSG, an electrode structure of the modulator is GSSGSSG.

With reference to the second aspect and the foregoing implementations of the second aspect, in another implementation of the second aspect, a silicon non-etched area is reserved below an S electrode in at least one GSSG electrode structure.

According to the modulator provided in this embodiment of this application, the silicon non-etched area is reserved below the S electrode, so that a series electrode connected to a PN can be reduced, thereby implementing high-speed modulation.

According to a third aspect, a drive apparatus is provided, including the signal generation apparatus according to the first aspect and the modulator according to the second aspect, where N pairs of differential signals output by the signal generation apparatus are used to directly drive the X modulator segments of the modulator. The drive signals generated by the signal generation apparatus provided in the first aspect directly drive the modulators, and there is no need to output the drive signals through the driver to drive the modulators, thereby reducing drive power consumption of the drive apparatus.

According to a fourth aspect, a system is provided, including the drive apparatus provided in the third aspect and a signal receiving apparatus, where the signal receiving apparatus includes a photoelectric detector PD, a trans-impedance amplifier TIA, and a deserializer.

According to a fifth aspect, a signal generation method is provided, including: encoding to-be-sent data, to obtain a first electrical signal; performing parallel-to-serial processing on the first electrical signal, to obtain a second electrical signal; processing the second electrical signal, to obtain a third electrical signal; and amplifying, by N amplifiers, the third electrical signal, to obtain N pairs of differential signals, where N is an integer greater than 2.

According to the signal generation method provided in this embodiment of this application, the N pairs of differential signals that are output and obtained by the N amplifiers by amplifying the third electrical signal are used as generated drive signals, and a signal that is generated by amplifying a signal output by a signal generation apparatus does not need to be used as a drive signal, so that power consumption for generating a drive signal can be reduced.

With reference to the fifth aspect, in some implementations of the fifth aspect, the method further includes: performing delay processing on a first pair of differential signals by using a delayer, where the delayer is disposed at a signal input end of a first amplifier and/or a signal output end of the first amplifier, the first pair of differential signals are differential signals output by the first amplifier, and the first amplifier is any one of the N amplifiers. In a possible implementation, a delay of the delayer is $(M-1)*t$, where M indicates an $M^{th}$ modulator segment in X modulator segments driven by the first pair of differential signals, X is an integer greater than 1, M is a positive integer less than or equal to X, and t is a preset unit delay.

According to the signal generation method provided in this embodiment of this application, delay processing is performed on the differential signals output by the amplifiers, so that a delay requirement is met when the differential signals output by the amplifiers drive the corresponding modulators.

With reference to the fifth aspect and the foregoing implementations of the fifth aspect, in an implementation of the fifth aspect, the N pairs of differential signals drive modulation arms of the X modulator segments, and two modulation arms of at least one of the X modulator segments are driven by two pairs of differential signals, where X is an integer greater than 1.

With reference to the fifth aspect and the foregoing implementations of the fifth aspect, in another implementation of the fifth aspect, an electrode structure of the modulation arm includes an electrode structure of GSSG; and an electrode structure of at least one of the X modulator segments is GSSGSSG. According to the signal generation method provided in this embodiment of this application, the electrode structure of the modulation arm of the modulator is designed as GSSG, so that a single modulation arm can meet differential driving.

With reference to the fifth aspect and the foregoing implementations of the fifth aspect, in still another implementation of the fifth aspect, a silicon non-etched area is reserved below an S electrode in at least one GSSG electrode structure. The silicon non-etched area is an area that cannot be etched by silicon. According to the signal generation method provided in this embodiment of this application, the silicon non-etched area is reserved below the S electrode, so that a series electrode connected to a PN can be reduced, thereby implementing high-speed modulation.

According to the signal generation apparatus and method and the system that are provided in this application, because the N pairs of differential signals output by the signal generation apparatus directly drive the modulators, a driver is not required, and power consumption can be reduced.

DESCRIPTION OF EMBODIMENTS

The following describes technical solutions of this application with reference to accompanying drawings. Specifically, the technical solutions in the embodiments of this application may be applied to an optical module including a serializer/deserializer (SerDes) or a modulator.

Figure 1:
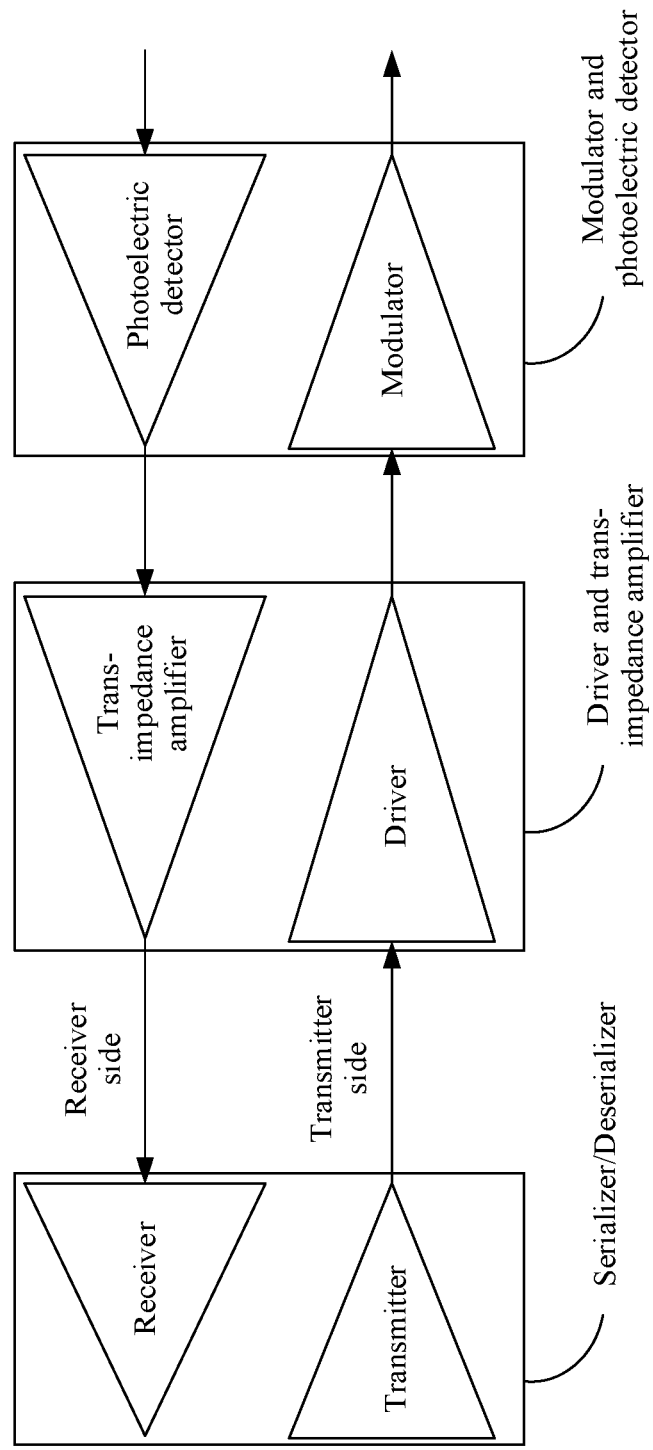
FIG. 1 is a schematic diagram of a conventional optical module.

FIG. 1 is a schematic diagram of a conventional optical module. The optical module includes a SerDes, a driver, a trans-impedance amplifier, a photoelectric detector, and a modulator. To describe the technical solutions of this application in the following sections, the foregoing parts in FIG. 1 that are related to the embodiments of this application are briefly described first.

SerDes: As shown in FIG. 1, the SerDes includes a receiver and a transmitter. The SerDes is a mainstream time-division multiplexing (TDM) and point-to-point (P2P) serial communication technology. In other words, a transmitter side of the SerDes converts a plurality of channels of low-speed parallel signals into high-speed serial signals, and the high-speed serial signals pass through a transmission medium (for example, an optical cable or a copper cable). A receiver side of the SerDes converts high-speed serial signals into low-speed parallel signals. Such a point-to-point serial communication technology uses a channel capacity of the transmission medium, reduces the number of required transmission channels and component pins, and improves a signal transmission speed, thereby greatly reducing communication costs.

It should be understood that a signal processing direction of the transmitter in the SerDes in FIG. 1 is the transmitter side of the SerDes, and a signal processing direction of the receiver in the SerDes in FIG. 1 is the receiver side of the SerDes.

Driver: In a broad sense, a driver refers to the drive hardware that drives a particular type of device. The driver shown in FIG. 1 is mainly configured to amplify the signals sent by the transmitter side of the SerDes, and then, use the amplified signals to drive the modulator.

Trans-impedance amplifier (TIA): A trans-impedance amplifier is a type of amplifier. The TIA shown in FIG. 1 is mainly configured to amplify an electrical signal sent by the photoelectric detector shown in FIG. 1. The amplified electrical signal is used as an input signal of the receiver of the SerDes. Because the TIA has the advantage of having a high bandwidth, the TIA is usually used in a high-speed circuit. For example, the TIA is usually used in an optoelectronic transmission communications system. It should be understood that the type of the amplifier is defined based on a type of an input/output signal of the amplifier. The type of the amplifier is not limited in this application.

Photoelectric detector (PD): A PD is configured to convert an optical signal into an electrical signal. Based on how a device responds to energy input or a working mechanism of the device, PDs can be classified into two types: photon detectors and heat detectors. The PD shown in FIG. 1 is configured to convert the optical signal on the receiver side of the SerDes into an electrical signal, and input the converted electrical signal into the TIA.

Modulator: A modulator converts an electrical signal provided by a signal source into an optical signal. The modulator shown in FIG. 1 may be a Mach-Zehnder modulator (MZM).

With rapid development of data center technologies, the requirement for a board port capacity is increasing, and the power consumption of optical modules is also increasing. In addition, a silicon photonics integration technology can implement large-scale integration, and greatly reduce costs of conventional optical modules. However, as integration increases, power consumption of the optical modules also becomes a great problem. In the prior art, the power consumption of a driver and a TIA in some components of the optical module shown in FIG. 1 becomes a main source of power consumption of the optical module.

Currently, commercial high-speed drivers and TIAs in the industry are mainly based on a III-V compound material platform. The drivers and TIAs based on the III-IV compound material platform have an advantage of being relatively easy to achieve high performance, but their power consumption is usually relatively high. The foregoing high performance includes high speed, low noise, high gain, and the like.

When an optical module needs multi-channel integration, the number of channels that can be integrated is usually limited by power consumption of a driver and a TIA in the optical module. Currently, the following methods are used in the industry to reduce the power consumption of drivers and TIAs:

1. The driver and the TIA are manufactured by using a complementary metal-oxide-semiconductor (CMOS), or a bipolar junction transistor and complementary metal-oxide-semiconductor (BICMOS) process.

2. The power consumption of the driver and the TIA is reduced by using modulators in some optical module components shown in FIG. 1. For example, modulation efficiency of the modulator is improved, or a drive voltage required by the modulator is reduced through segmented driving, thereby reducing the power consumption of the driver and the TIA.

It should be understood that the embodiments of this application mainly relate to improvement on the transmitter side of the SerDes. The following first focuses on a signal processing process on a transmitter side of a SerDes with reference to FIG. 2.

Figure 2:
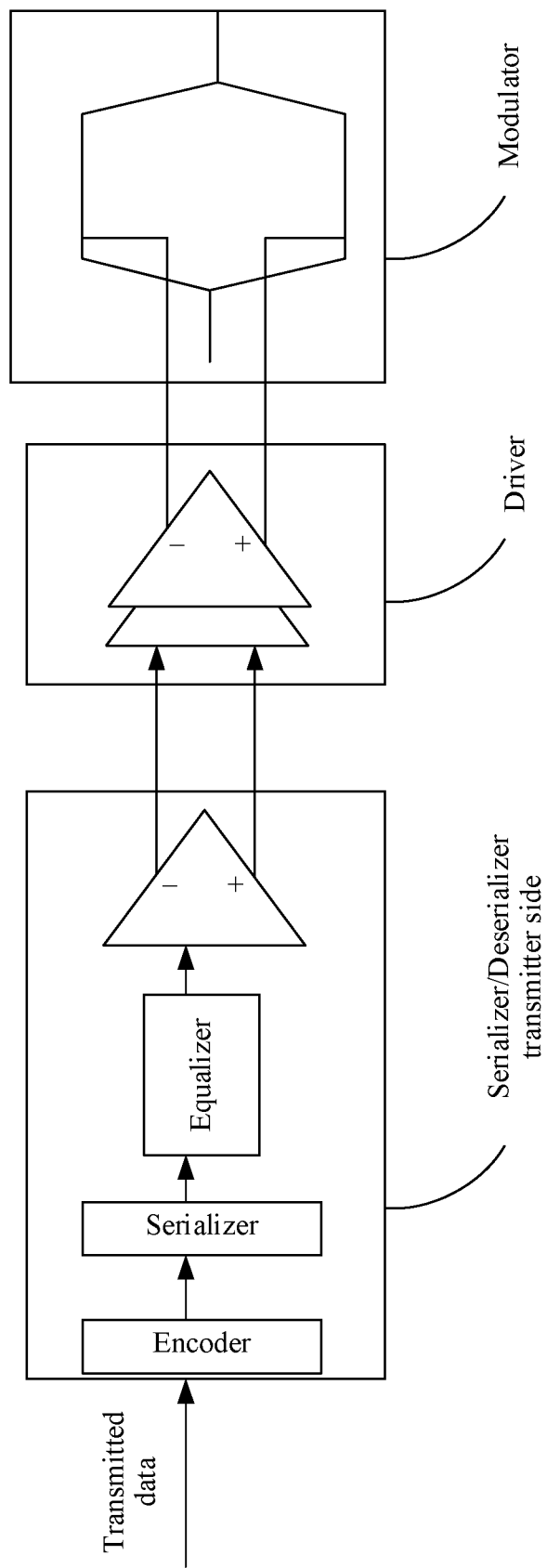
FIG. 2 is a flowchart of signal processing on a transmitter side of a conventional serializer/deserializer.

FIG. 2 is a flowchart of signal processing on a transmitter side of a conventional SerDes. The TX side of the SerDes, a driver, and a modulator are involved in the signal processing process. A process of processing an internal signal on the transmitter side of the SerDes includes data encoding, data parallel-to-serial conversion, equalization, and amplification and output, respectively implemented by an encoder, a serializer, an equalizer, and an amplifier. The following briefly describes the foregoing internal components on the TX side of the SerDes.

Encoder: An encoder encodes a signal (for example, a bit stream) or data based on a specific rule. For example, 64/66 encoding is to encode 64-bit data into 66-bit data. The first two bits are added as a synchronization header, which is used for data alignment at the receive end and received data bitstream synchronization.

Serializer: A serializer converts a plurality of low-speed parallel signals into high-speed serial signals.

Equalizer (EQ): An equalizer processes to-be-transmitted and received signals to improve signal quality. The signal quality refers to the eye opening, inter-symbol interference, jitter, and the like of a signal.

Amplifier: An amplifier is configured to amplify a signal input into the amplifier.

It can be learned from FIG. 2 that the transmitter side of the SerDes sends an electrical signal. The electrical signal is amplified by the driver, and the amplified electrical signal drives the modulator. The modulator converts the electrical signal into an optical signal, and the optical signal is sent to a destination signal receiver through an optical link. It should be understood that, how the optical signal is sent to the destination optical signal receiver through the optical link is not limited in this application. This embodiment of this application mainly relates to how the electrical signal sent by the SerDes arrives at the modulator.

It can be learned from the foregoing description that because power consumption of the driver is relatively high, overall power consumption of the optical module is extremely high when a plurality of channels are integrated. Therefore, a circuit design on the transmitter side of the SerDes shown in FIG. 2 limits integration of the optical module. In addition, the circuit design on the transmitter side of the SerDes shown in FIG. 2 requires an independent driver chip, resulting in relatively high costs.

Figure 3:
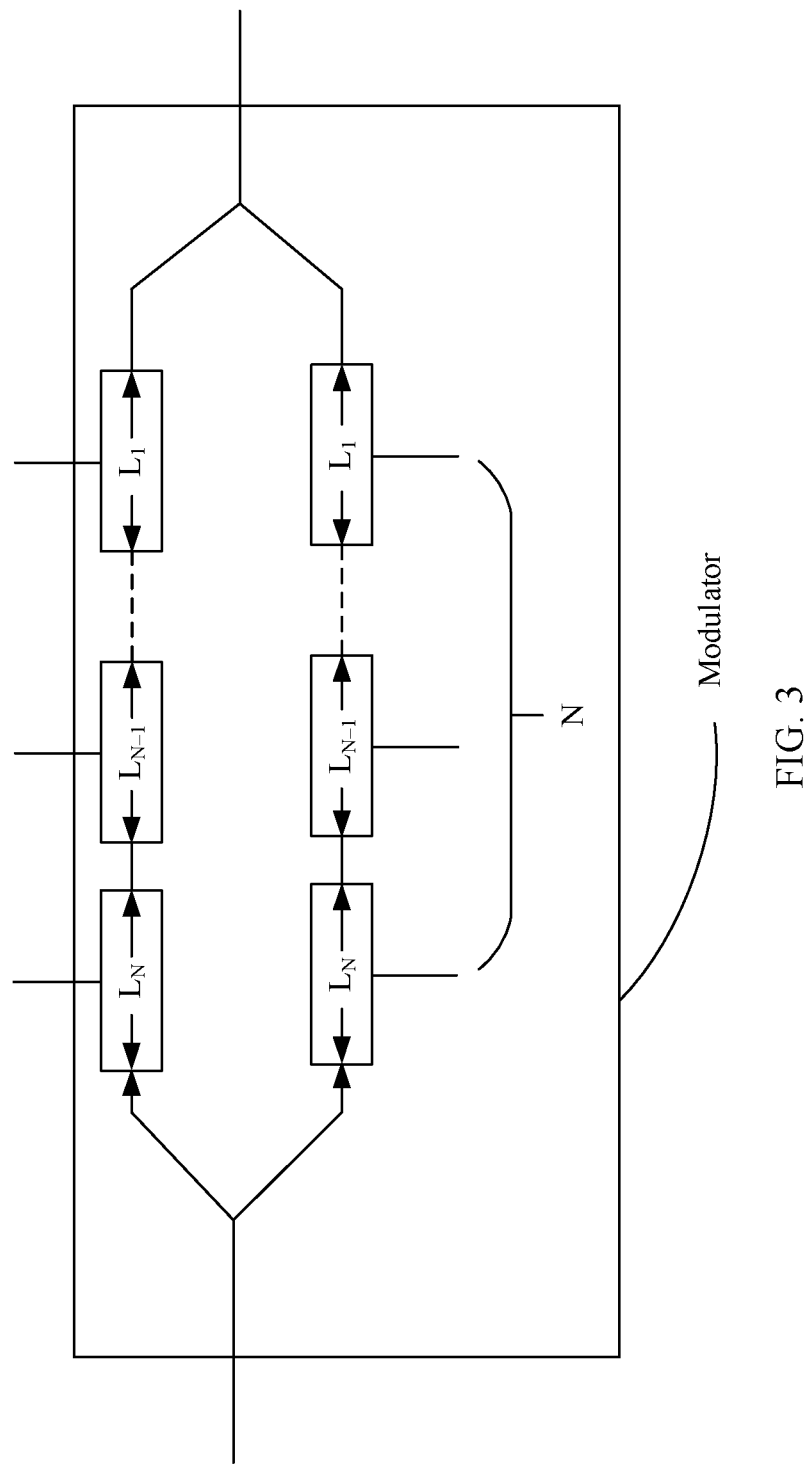
FIG. 3 is a structural diagram of a modulator.

To reduce the power consumption of the optical module, measures can be made starting from the modulator. With reference to FIG. 3, the following briefly describes how to start from a modulator to reduce power consumption of an optical module.

FIG. 3 is a structural diagram of a modulator. The modulator has a segmented electrode, and is divided into N modulator segments (for example, $L_N$, $L_{N-1}$, ..., and $L_1$ in FIG. 3). A driver of each modulator segment may be driven by a CMOS driver with low power consumption, so that power consumption of the driver can be reduced.

However, a drive voltage of a conventional CMOS driver is only about 1 V, and this can be implemented only when modulation efficiency of a modulator is very high. In the prior art, it is difficult for a modulator of a common carrier dispersion effect PN junction structure to be driven based on a CMOS driver. To reduce power consumption of an optical module, this application provides a signal generation apparatus and method, a modulator, a drive apparatus, and a system. The signal generation apparatus may include a modulator. For details, refer to descriptions in different embodiments.

In this embodiment of this application, a signal processing process (namely, a signal processing link from an electrical signal to an optical signal) on the transmitter side of the SerDes shown in FIG. 2 is comprehensively considered. A structure of the SerDes and a modulator is adjusted to enable the SerDes to directly drive the modulator without passing through the driver, thereby reducing the power consumption of the optical module.

The following describes in detail the signal generation apparatus in the embodiments of this application with reference to FIG. 4 to FIG. 10.

Figure 4:
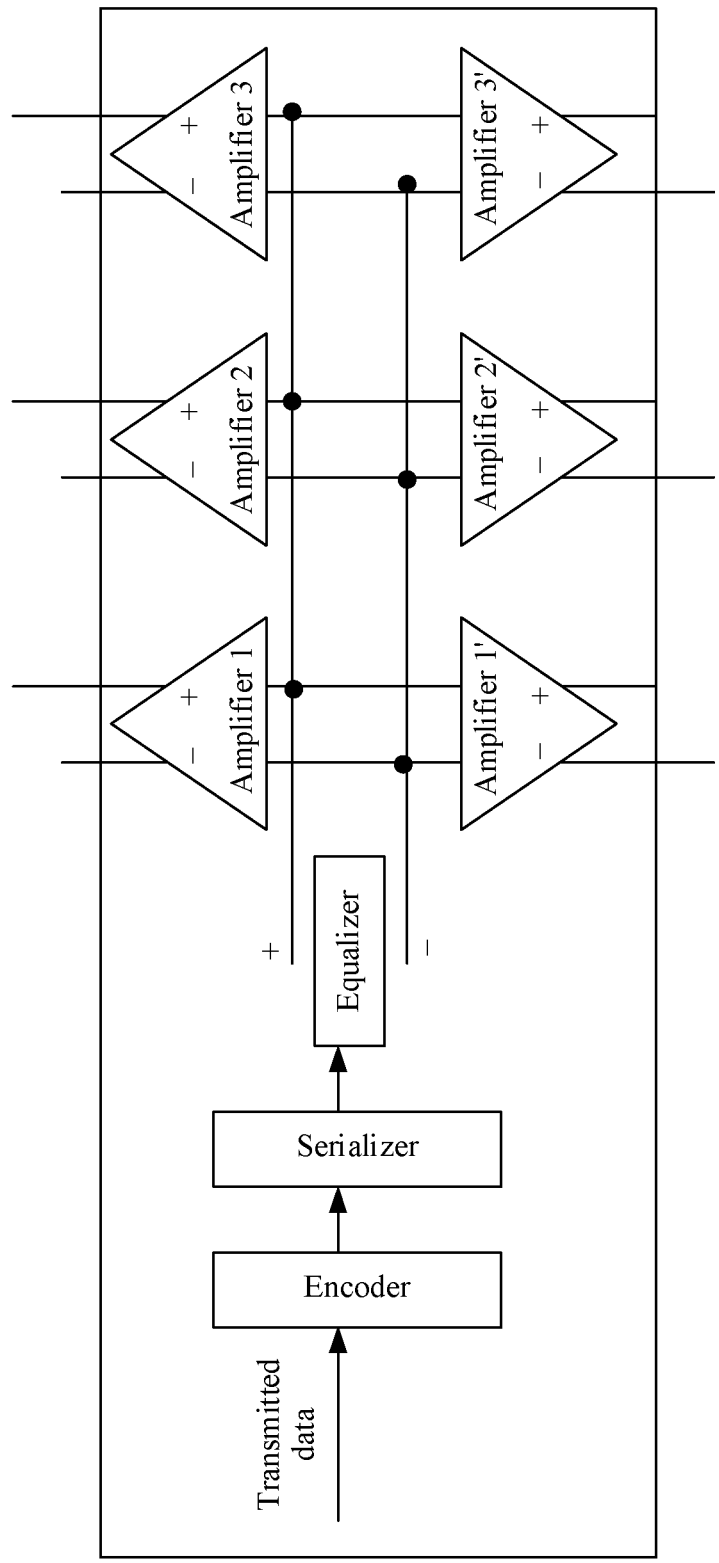
FIG. 4 is a schematic diagram of a signal generation apparatus according to an embodiment of this application.

FIG. 4 is a schematic diagram of a signal generation apparatus according to an embodiment of this application. The apparatus includes an encoder, a serializer, an equalizer, and N amplifiers. The signal generation apparatus mentioned in this application may be the foregoing SerDes.

The encoder is similar to that shown in FIG. 2, and is configured to encode to-be-sent data, to obtain a first electrical signal. For example, transmitted data shown in FIG. 4 is a bit stream, and the encoder converts the bit stream into a first electrical signal that can be used for communication, transmission, and storage. It should be understood that the first electrical signal may be a pair of differential signals, or may be a non-differential signal. This is related to a circuit design in which the encoder is located. A property of the first electrical signal is not limited in this embodiment of this application.

Similar to that shown in FIG. 2, the serializer is configured to perform parallel-to-serial processing on the first electrical signal to obtain a second electrical signal. For example, the first electrical signal is a plurality of low-speed parallel signals, and the serializer converts the first electrical signal into a second electrical signal that is a high-speed serial signal.

It should be understood that the second electrical signal may be a pair of differential signals, or may be a non-differential signal. This is related to a circuit design in which the serializer is located. A property of the second electrical signal is not limited in this embodiment of this application.

The equalizer is similar to that shown in FIG. 2, and is configured to process the second electrical signal to obtain a third electrical signal, for example, to improve signal quality of the second electrical signal. Specifically, the equalizer may dynamically adjust the signal quality of the second electrical signal by using a filter, to obtain the third electrical signal. In other words, the amount of the second electrical signal that needs to be adjusted is determined based on a feedback value of a feedback unit, until the third electrical signal is obtained. Alternatively, the equalizer adjusts the signal quality of the second electrical signal based on a preset fixed filter, to obtain the third electrical signal. It should be understood that, in this application, how the equalizer processes the second electrical signal to obtain the third electrical signal is not limited, and any one of the foregoing adjustment methods may be used. It should be further understood that, it can be learned from FIG. 4 that the third electrical signal is a pair of differential signals, including one positive signal and one negative signal.

The third electrical signals are amplified by the N amplifiers to obtain N pairs of differential signals. In other words, the N amplifiers are configured to amplify N pairs of differential input signals to obtain N pairs of differential output signals. The N pairs of differential input signals are signals obtained after the third electrical signals are distributed to the N amplifiers, and N is an integer greater than 2. The third electrical signals are divided into the N pairs of differential input signals shown in FIG. 4, and the N pairs of differential input signals are respectively input into the N amplifiers. Each pair of differential signals include one positive signal and one negative signal.

It should be understood that a signal generated by the signal generation apparatus is a drive signal for driving a modulator. Different from the prior art, a signal generated by a signal generation apparatus directly drives a modulator, and does not need to be amplified by a driver. Therefore, the signal generation apparatus provided in this embodiment of this application is configured to generate a drive signal, so that power consumption can be reduced.

It can be learned from FIG. 4 that, the signal generation apparatus may be the foregoing transmitter side of the SerDes, which includes the encoder that encodes the transmitted data internally, the serializer that completes parallel-to-serial conversion of the transmitted data, and the equalizer. Finally, the N amplifiers amplify and output the data.

According to the signal generation apparatus provided in this embodiment of this application, the input signals of last N amplifiers (amplifiers 1, 1', 2, 2', 3, and 3' shown in FIG. 4) are output signals of the equalizer shown in FIG. 4 distributed to the N amplifiers.

Optionally, the third electrical signal may be evenly distributed as N pairs of differential input signals and then input to the N amplifiers, or randomly distributed as N pairs of differential input signals based on a circuit design and then input to the N amplifiers.

Optionally, in some embodiments, N=3. To be specific, the signal generation apparatus provided in this embodiment of this application includes three amplifiers. Further, two amplifiers of the three amplifiers are referred to as one pair of amplifiers, and two pairs of output differential signals are respectively used to drive two modulation arms of one modulator segment. The other amplifier outputs one pair of differential signals, where one positive signal and one negative signal of the pair of differential signals are respectively used to drive two modulation arms of another modulator segment.

Optionally, in some embodiments, N=4. To be specific, the signal generation apparatus provided in this embodiment of this application includes four amplifiers. Further, the four amplifiers are referred to as two pairs of amplifiers, and each two of four pairs of output differential signals are respectively used to drive two modulation arms of one modulator segment. In other words, the two pairs of amplifiers can drive two modulator segments, and there is one pair of amplifiers that are configured to output two pairs of differential signals that drive two modulation arms of a same modulator segment.

Optionally, in some embodiments, N=6. To be specific, the signal generation apparatus provided in this embodiment of this application includes six amplifiers. Further, the six amplifiers are referred to as three pairs of amplifiers, and each two of six pairs of output differential signals are respectively used to drive two modulation arms of one modulator segment. In other words, the three pairs of amplifiers can drive three modulator segments, and there is one pair of amplifiers that are configured to output two pairs of differential signals that drive two modulation arms of a same modulator segment.

The two pairs of differential signals output by the pair of amplifiers mentioned above are respectively used to drive two modulation arms of a same modulator segment. This relates to a correspondence between one pair of amplifiers and one pair of modulation arms.

Figure 5:
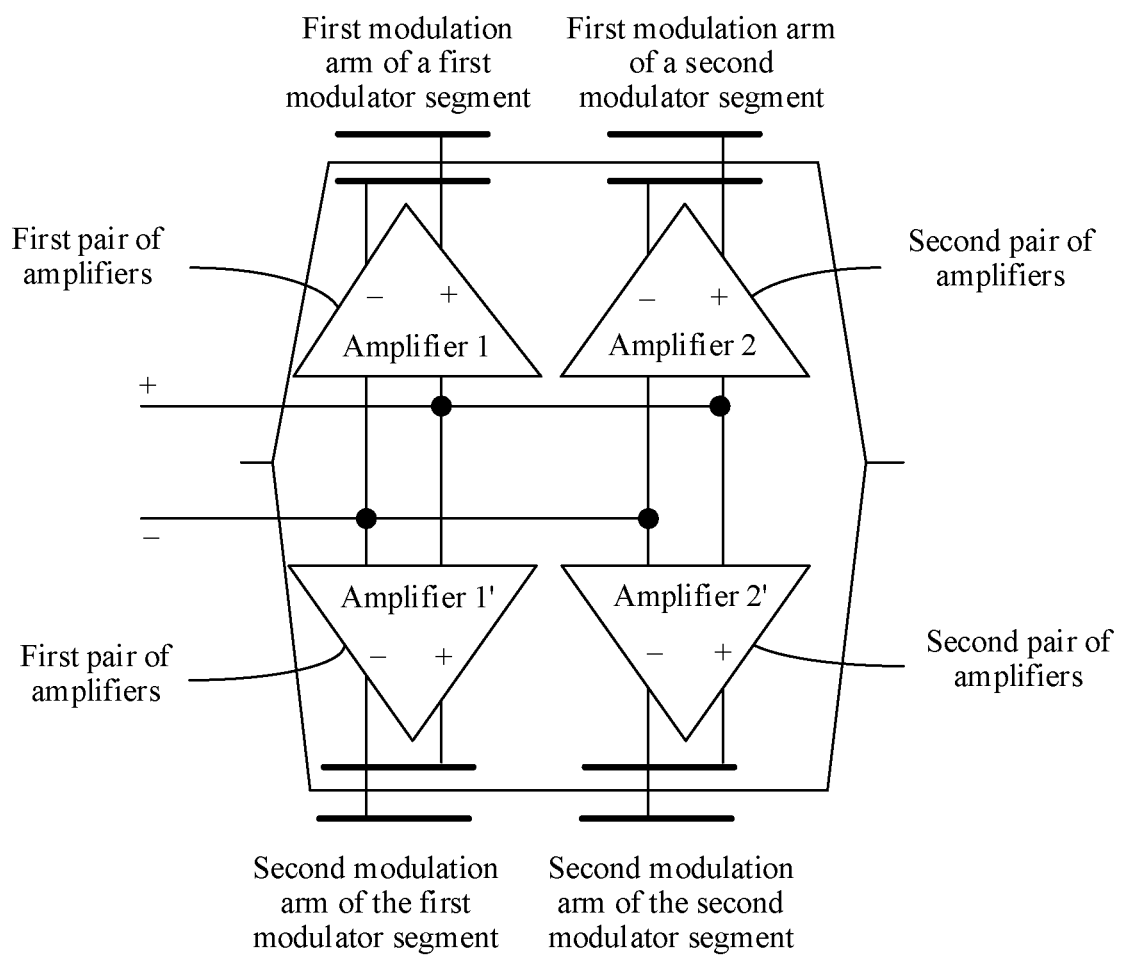
FIG. 5 is a schematic diagram of a correspondence between amplifiers and modulators.
Figure 6:
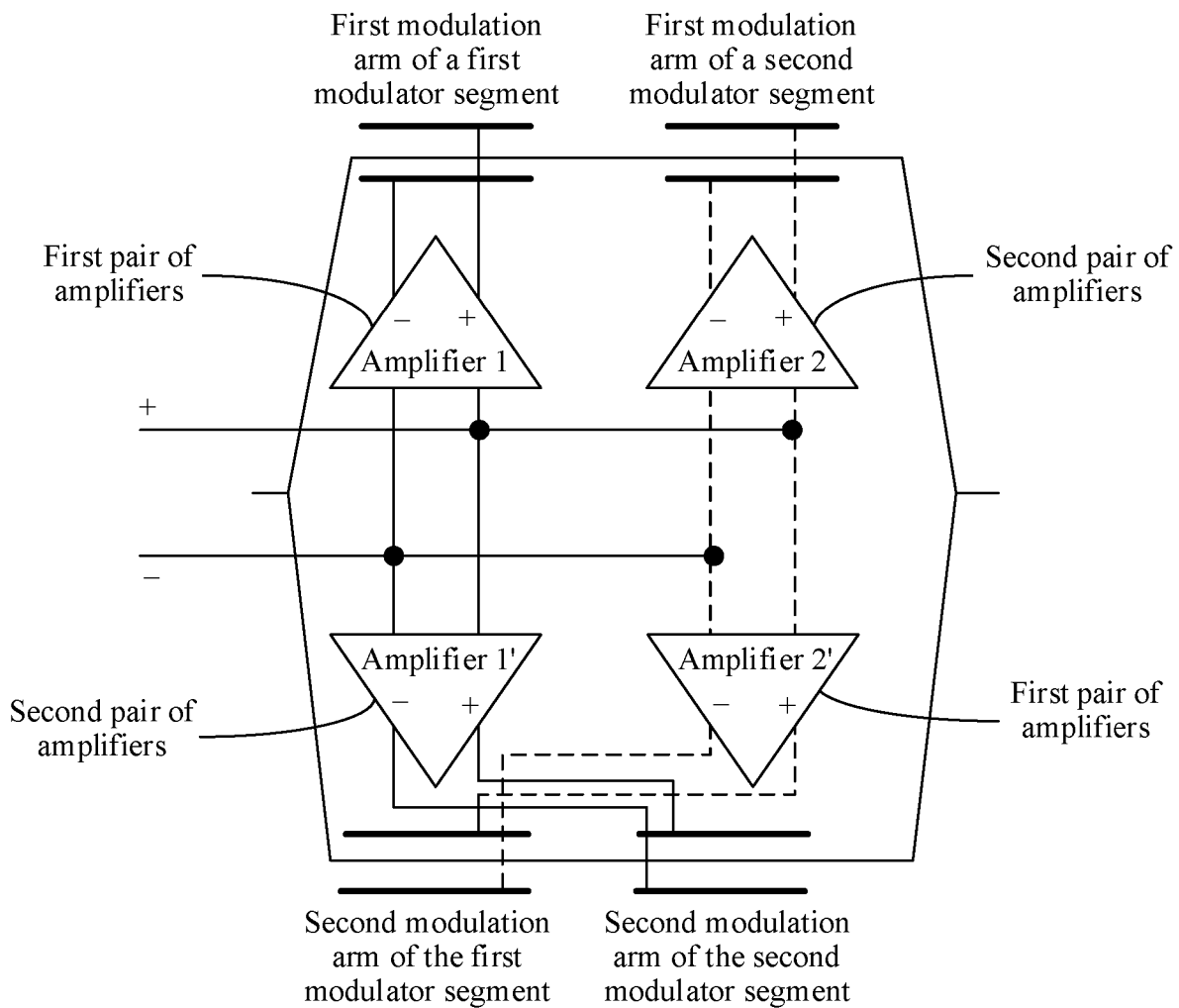
FIG. 6 is a schematic diagram of another correspondence between amplifiers and modulators.

The following briefly describes a correspondence between an amplifier and a modulator with reference to FIG. 5 and FIG. 6.

FIG. 5 is a schematic diagram of a correspondence between amplifiers and modulators. An amplifier 1, an amplifier 1', an amplifier 2, an amplifier 2', a first modulation arm of a first modulator segment, a second modulation arm of the first modulator segment, a first modulation arm of a second modulator segment, and a second modulation arm of the second modulator segment are included.

A differential signal output by the amplifier 1 is used to drive the first modulation arm of the first modulator segment, and a differential signal output by the amplifier 1' is used to drive the second modulation arm of the first modulator segment. Because both the first modulation arm of the first modulator segment and the second modulation arm of the first modulator segment belong to the first modulator segment, the amplifier 1 and the amplifier 1' are referred to as a first pair of amplifiers. A relationship between the first modulation arm and the second modulation arm of the second modulator segment and the amplifier 2 and the amplifier 2' is similar, and details are not described again. Similarly, the amplifier 2 and the amplifier 2' are referred to as a second pair of amplifiers.

FIG. 6 is a schematic diagram of another correspondence between amplifiers and modulators. An amplifier 1, an amplifier 1', an amplifier 2, an amplifier 2', a first modulation arm of a first modulator segment, a second modulation arm of the first modulator segment, a first modulation arm of a second modulator segment, and a second modulation arm of the second modulator segment are included.

A differential signal output by the amplifier 1 is used to drive the first modulation arm of the first modulator segment, and a differential signal output by the amplifier 2' is used to drive the second modulation arm of the first modulator segment. Because both the first modulation arm of the first modulator segment and the second modulation arm of the first modulator segment belong to the first modulator segment, the amplifier 1 and the amplifier 2' are referred to as a first pair of amplifiers. A relationship between the first modulation arm and the second modulation arm of the second modulator segment and the amplifier 2 and the amplifier 1' is similar, and details are not described again. Similarly, the amplifier 2 and the amplifier 1' are referred to as a second pair of amplifiers.

Similarly, in another possible embodiment, when a differential signal output by the amplifier 1 is used to drive the first modulation arm of the first modulator segment, and a differential signal output by the amplifier 2 is used to drive the second modulation arm of the first modulator segment, the amplifier 1 and the amplifier 2 are referred to as one pair of amplifiers. Examples are no longer provided one by one herein. It should be understood that in this embodiment of this application, locations of two amplifiers that can be referred to as one pair of amplifiers are not limited, provided that differential signals output by the two amplifiers are used to drive two modulation arms of a same modulator segment.

Optionally, a delayer is disposed at a signal input end of the first amplifier and/or a signal output end of the first amplifier, the delayer is configured to control a delay of the first pair of differential signals output by the first amplifier, and the first amplifier is any one of the N amplifiers in the foregoing signal generation apparatus.

Differential signals amplified by amplifiers function/drive on X modulator segments at the same time, and optical signals have a transmission delay in the X different modulator segments. This mismatch causes a decrease in a bandwidth of the modulator. An advantage of increasing the delayer is that this mismatch can be eliminated or reduced, thereby achieving a relatively high modulator bandwidth. It should be noted that a size of the delayer depends on a location of an amplifier corresponding to the delayer and a location of a modulation arm driven by the amplifier. For example, when a modulation arm of a modulator is close to an output end, in other words, an optical signal has a relatively large delay, the delay of a corresponding amplifier needs to be set to a relatively large delay.

Figure 7:
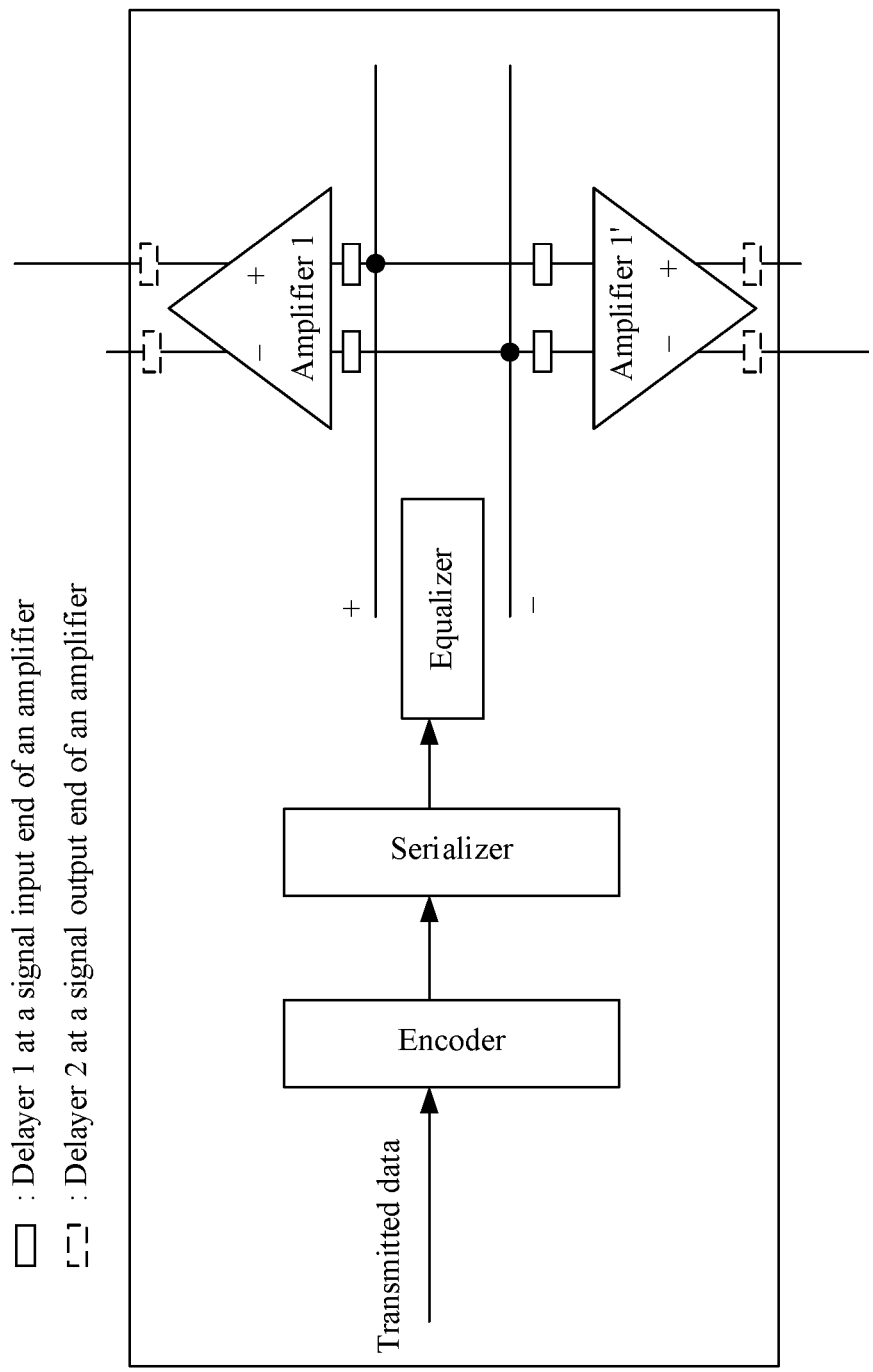
FIG. 7 is a schematic diagram of a possible placement location of a delayer.

FIG. 7 is a schematic diagram of a possible placement location of a delayer. As shown in FIG. 7, a delayer may be disposed at a signal input end of an amplifier and/or a signal output end of the amplifier, so that output differential signals meet a delay requirement. Specifically, a delayer may be disposed at the signal input end of the amplifier, or a delayer may be disposed at the signal output end of the amplifier, or delayers may be disposed at both the signal input end and the signal output end of the amplifier. This is not limited in this application.

Using FIG. 7 as an example, a delayer may be disposed at each of a signal input end of an amplifier 1 and a signal input end of an amplifier 1' (a delayer 1 shown in FIG. 7), or a delayer may be disposed at each of a signal output end of the amplifier 1 and a signal output end of the amplifier 1' (a delayer 2 shown in FIG. 7), delayers may be disposed at the signal input ends of the amplifier 1 and the amplifier 1' and the signal output ends of the amplifier 1 and the amplifier 1'. It should be understood that, the signal input end of the amplifier shown in FIG. 7 is a signal input end adjacent to the amplifier, and no other amplifier is used between the signal input end and the location at which the delayer is disposed. The signal output end of the amplifier shown in FIG. 7 is a signal output end adjacent to the amplifier, and no other amplifier is used between the signal input end and the location at which the delayer is disposed.

It should be further understood that the delayer may be a cable and include no other component. A length of the cable is so designed that differential signals that pass through the cable meet a delay requirement.

Further, when the first pair of differential signals are used to drive one modulation arm of an $M^{th}$ modulator segment, a delay of the delayer is $(M-1)*t$, where the $M^{th}$ modulator segment is an $M^{th}$ modulator segment in X modulator segments, X is an integer greater than 1, M is a positive integer less than or equal to X, and t is a preset unit delay.

It should be understood that the $M^{th}$ modulator segment in the X modulator segments is an $M^{th}$ modulator segment that is obtained after the X modulator segments are sequentially arranged in ascending order of distances from the X modulator segments to a location of the equalizer, and a transmission distance of an input signal input into the $M^{th}$ modulator segment is greater than that of each of the first M-1 modulator segments in the X modulator segments.

Optionally, in some embodiments, the preset unit delay t is a time interval required for completing transmission of one modulator segment based on the optical signal. Alternatively and optionally, in some embodiments, the preset unit delay t is a proper time interval that is set based on experience. For example, the preset unit delay t is an empirical value obtained based on a plurality of tests.

Figure 8:
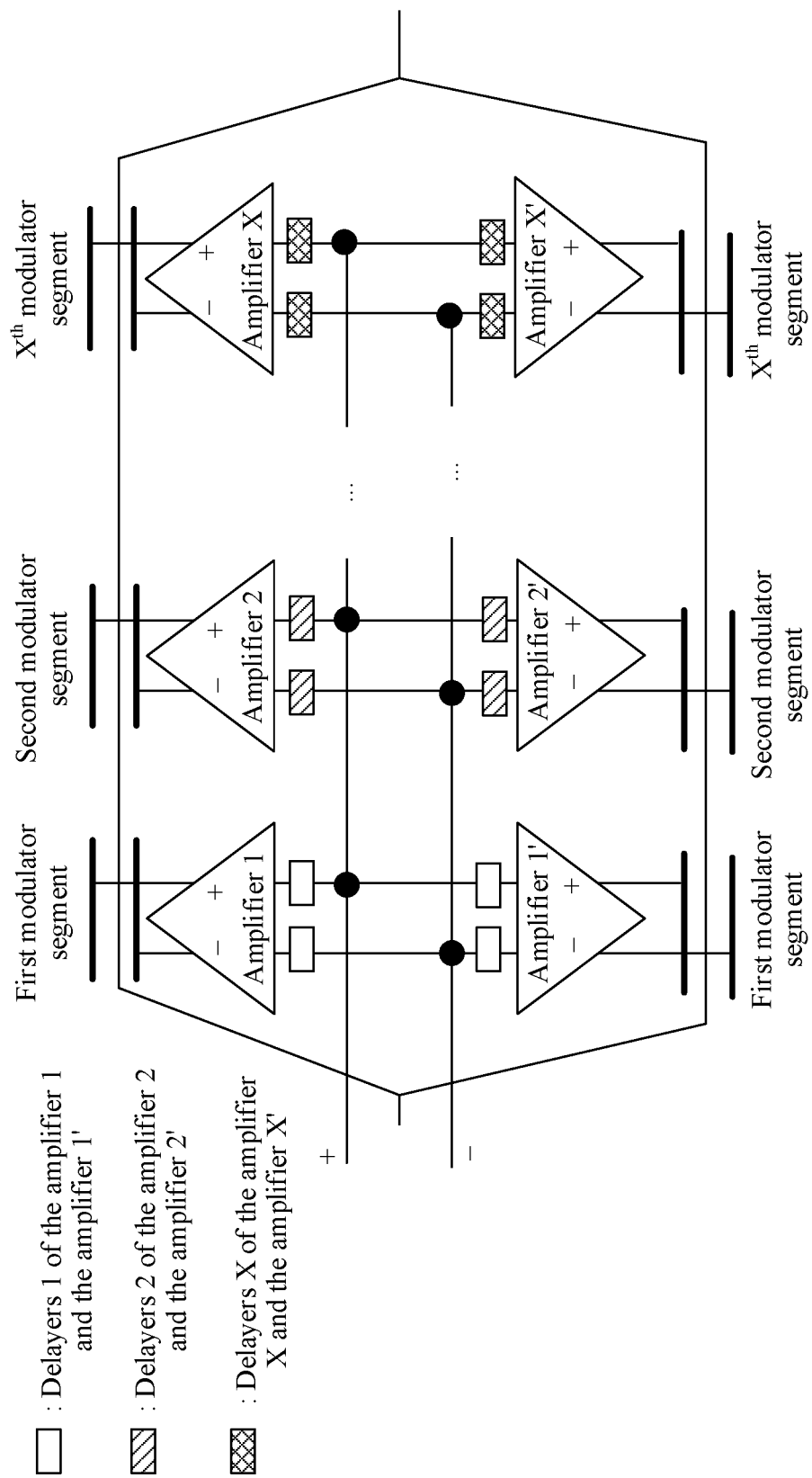
FIG. 8 is a schematic location diagram of a delayer.

FIG. 8 is a possible schematic location diagram of a delayer. An apparatus shown in FIG. 8 includes an amplifier 1, an amplifier 1', an amplifier 2, an amplifier 2', . . . , an amplifier X, an amplifier X', a first modulator segment, a second modulator segment, . . . , an $X^{th}$ modulator segment (a total of X modulator segments), a delayer 1, a delayer 2, . . . , and a delayer X (a total of X delayers). In this figure, each delayer is disposed at a signal input end of an amplifier.

Because two pairs of differential signals output by the amplifier 1 and the amplifier 1' are respectively used to drive two modulation arms of the first modulator segment in the X modulator segments, a delay 1 of the delayer 1 is $(M-1)*t=(1-1)*t=0$. In other words, no delayer may be disposed at signal input ends of the amplifier 1 and the amplifier 1'. Because two pairs of differential signals output by the amplifier 2 and the amplifier 2' are respectively used to drive two modulation arms of the second modulator segment in the X modulator segments, a delay 2 of the delayer 2 is $(2-1)*t=t$. Because two pairs of differential signals output by the amplifier X and the amplifier X' are respectively used to drive two modulation arms of the $X^{th}$ modulator segment in the X modulator segments, a delay X of the delayer 2 is $(X-1)*t$.

Figure 9:
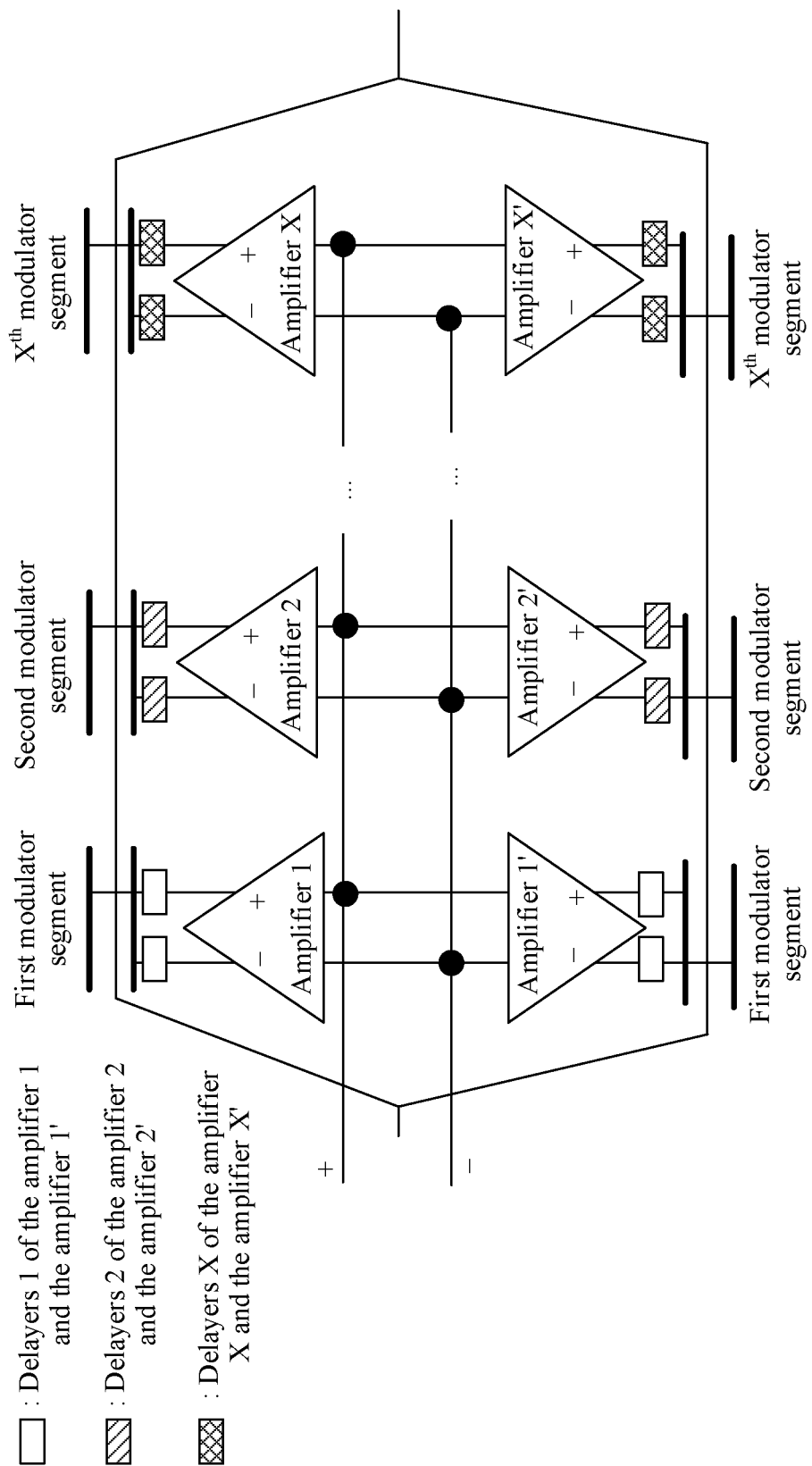
FIG. 9 is a schematic location diagram of another delayer.

FIG. 9 is another schematic location diagram of a delayer. A difference between FIG. 9 and FIG. 8 lies in that the delayer is placed at a signal output end of the amplifier. In FIG. 9, a delay setting of the delayer is similar to the description in FIG. 8, and details are not described again.

Figure 10:
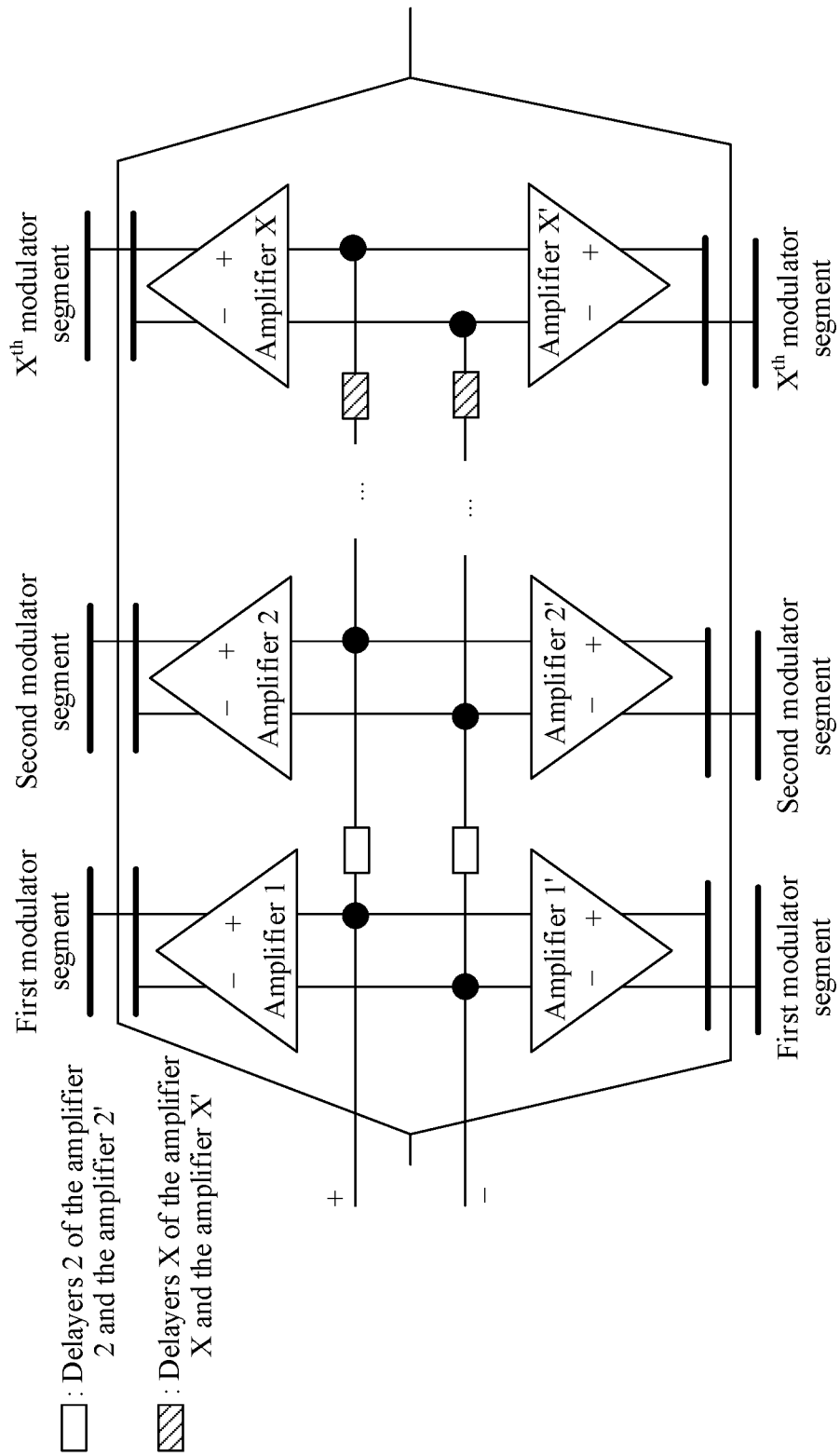
FIG. 10 is a schematic location diagram of still another delayer.

FIG. 10 is still another schematic location diagram of a delayer. Different from that shown in FIG. 8, the delayer in FIG. 10 is disposed on a general circuit for transmitting the input signals of the N amplifiers.

Similar to FIG. 8, in FIG. 10, no delayer may be disposed in the amplifier 1 and the amplifier 1'. The following uses as an example an embodiment in which a delayer of each of the amplifier 2, the amplifier 2', the amplifier X, and the amplifier X' is disposed for description.

Because the two pairs of differential signals output by the amplifier 2 and the amplifier 2' are respectively used to drive the two modulation arms of the second modulator segment, in a process of transmitting an optical signal from the first modulator segment to the second modulator segment, a signal transmission delay of the optical signal is the time period for passing through one modulator segment. In this application, a transmission delay of a signal in one modulator segment is defined as a preset unit delay t. In this case, during setting of the delay of the delayer 2, a transmission delay of a signal in one modulator segment needs to be considered. Further, because the delayer 2 on the general circuit for transmitting the input signals of the N amplifiers is a first delayer on the general circuit, a delay caused by another delayer on the general circuit does not need to be considered. Therefore, the delay of the delayer 2 is $2=1*t=t$.

It should be understood that a delayer is disposed at a signal input end of each amplifier after the amplifier 2 and the amplifier 2', but this is not shown in FIG. 10.

Because the two pairs of differential signals output by the amplifier X and the amplifier X' are respectively used to drive the two modulation arms of the $X^{th}$ modulator segment, a delayer is disposed on each amplifier before the amplifier X and the amplifier X', and the delayer is disposed on the general circuit for transmitting the input signals of the N amplifiers, it may be understood that the delay of transmitting a signal from a circuit on which an amplifier X-1 and an amplifier X-1' that correspond to an $(X-1)^{th}$ modulator segment are located to a circuit on which the amplifier X and the amplifier X' are located is still the delay of one modulator.

In the delayer setting manner shown in FIG. 10, delays of all delayers need to be equal, and are equal to t, and all are transmission delays required for transmitting an optical signal from a previous modulator segment to a next modulator segment in two consecutive modulators.

It should be further understood that FIG. 8 to FIG. 10 are merely examples for describing possible delayer setting manners, and do not limit the protection scope of this application. Variations that can be readily figured out falls within the protection scope of this application. For example, a plurality of delayers may be disposed in one amplifier, provided that delay values of the plurality of delayers meet a delay requirement. Alternatively, delayers may be disposed based on two or more forms shown in FIG. 8 to FIG. 10. In this way, a delay value of a single delayer is also different from that in the foregoing description, and details are not listed herein again.

The following describes in detail the modulator in the embodiments of this application with reference to FIG. 11 to FIG. 15.

Figure 11:
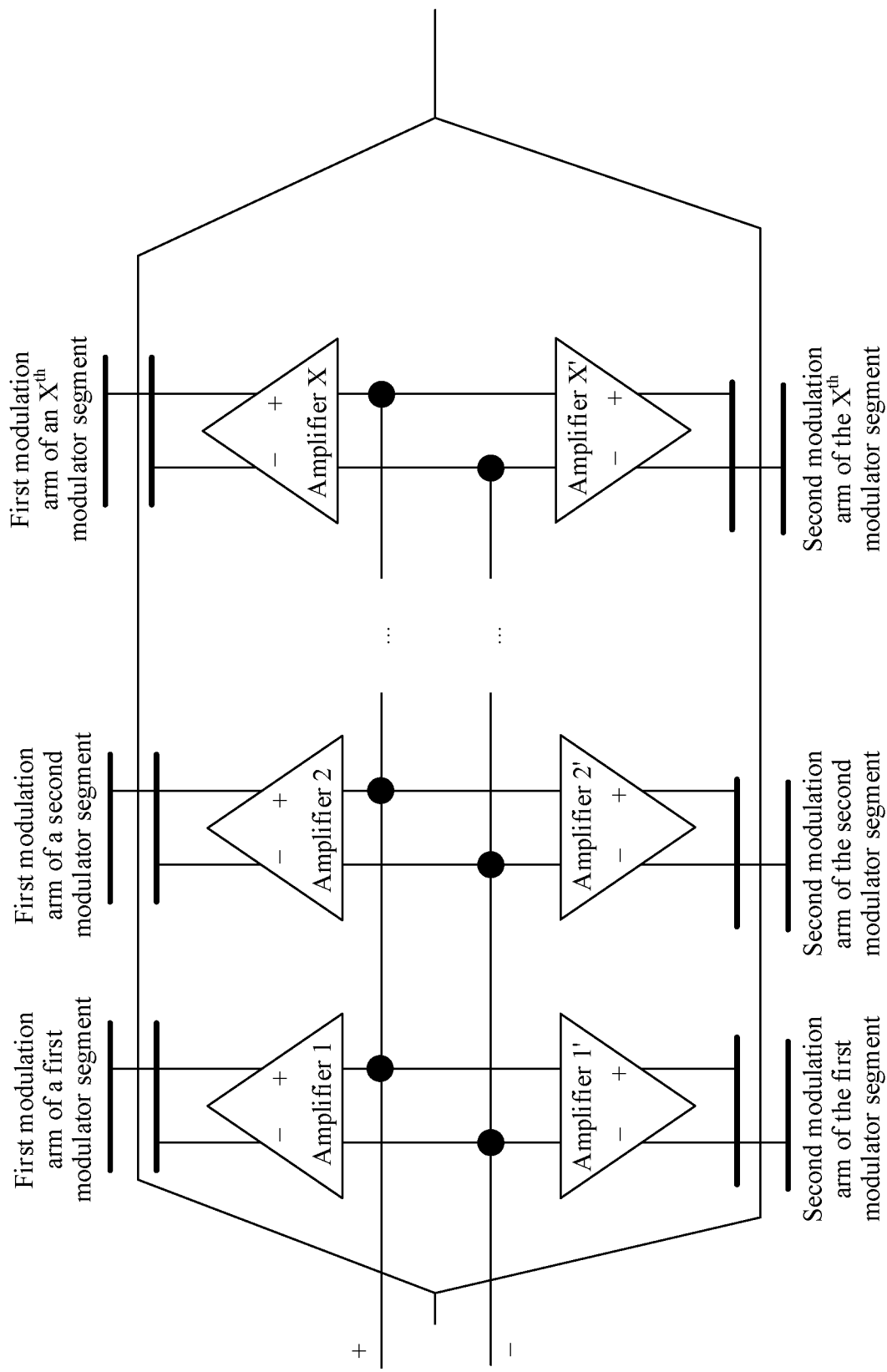
FIG. 11 is a schematic diagram of a structure of a modulator according to an embodiment of this application.

FIG. 11 is a schematic diagram of a structure of a modulator according to an embodiment of this application. The modulator includes X modulator segments, where each modulator segment includes two modulation arms.

As shown in FIG. 11, in this embodiment of this application, the modulator is divided into X segments, or is divided into X segments of electrodes. X is an integer greater than 1. A quantity of segments shown in FIG. 11 is merely an example, and does not limit the protection scope of this application.

With reference to the signal generation apparatus described in FIG. 4 to FIG. 10, when the N pairs of differential signals generated by the signal generation apparatus are used to drive the X modulator segments, two modulation arms of each modulator segment may be driven by two pairs of differential signals; or two modulation arms of at least one modulator segment are driven by two pairs of differential signals, for example, two modulation arms of one modulator segment are respectively driven by a positive signal and a negative signal in a pair of differential signals.

One pair of differential signals are input into each of two modulation arms of a first modulator to form a double-arm double-differential driving structure. The differential signals are in the N differential signals and meet the preset correspondence with the first modulator, and the first modulator is any one of the X modulator segments.

It can be learned from FIG. 11 that each modulator segment includes two modulation arms (a first modulation arm and a second modulation arm shown in FIG. 11), and each modulation arm is driven by one pair of differential signals.

The X modulator segments in FIG. 11 and the foregoing N pairs of differential signals meet a preset correspondence. Optionally, the preset correspondence is that two pairs of differential signals are used as drive signals of one modulator segment to drive the corresponding modulator. Alternatively and optionally, the foregoing correspondence is that one pair of amplifiers correspond to one modulator segment in FIG. 5 and FIG. 6. In this case, two pairs of differential signals output by the pair of amplifiers correspond to the modulator segment, and the two pairs of differential signals are used to drive two modulation arms of the modulator segment that meet the preset correspondence.

When the first modulator is an $i^{th}$ modulator segment in the X modulator segments in FIG. 11, one pair of differential signals are input into each of the two modulation arms of the first modulator, to form a dual-arm dual-differential driving structure. Differential signals input into a first modulation arm of the $i^{th}$ modulator segment are one pair of differential signals output by an amplifier i. Differential signals input by a second modulation arm of the $i^{th}$ modulator segment is one pair of differential signals output by an amplifier i', where $i=1, 2, \ldots, X$.

Figure 12:
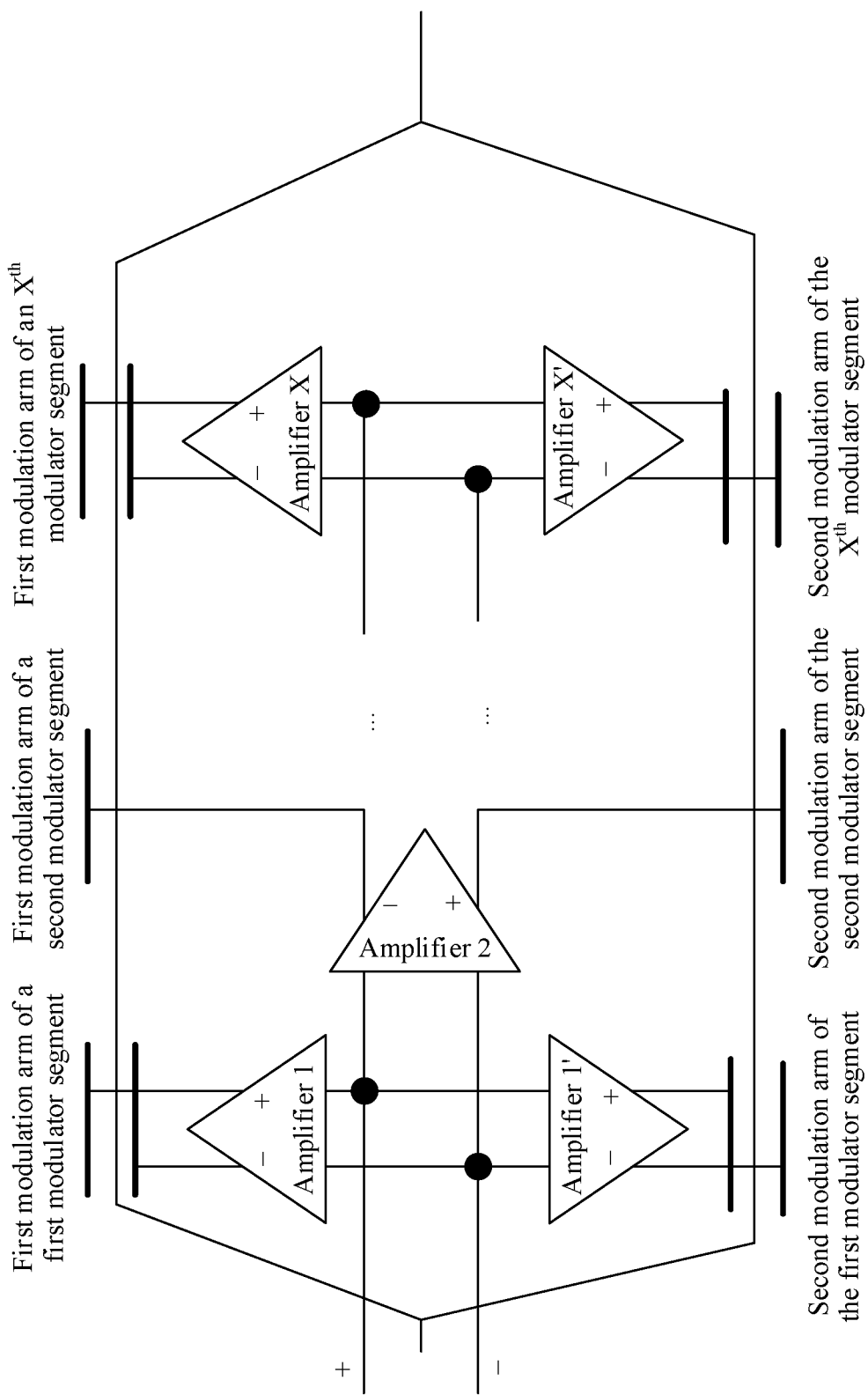
FIG. 12 is a schematic diagram of a structure of another modulator according to an embodiment of this application.

FIG. 12 is a schematic diagram of a structure of another modulator according to an embodiment of this application. This figure includes X modulator segments, and each modulator segment includes two modulation arms. Two modulation arms of a second modulator segment are driven by one positive signal and one negative signal of one pair of differential signals.

It should be understood that, compared with the prior art in which each modulation arm is driven by one signal (positive or negative) in differential signals, in this application, when two modulation arms of at least one modulator segment included in the X modulator segments are driven by two pairs of differential signals, modulator efficiency can still be increased.

Optionally, in some embodiments, the modulation arm includes an electrode structure of GSSG, and an electrode structure of at least one of the N modulator segments is GSSGSSG. It should be understood that G in the electrode structure refers to a ground, and S in the electrode structure refers to a signal. Compared with an electrode structure of a modulation arm in the prior art, the electrode structure of the modulation arm of the modulator provided in this application has one more S electrode. This is mainly because drive signals of each modulation arm of the modulator in the embodiments of this application are one pair of differential signals, while drive signals of two modulation arms of a modulator in the prior art are one pair of differential signals.

Figure 13:
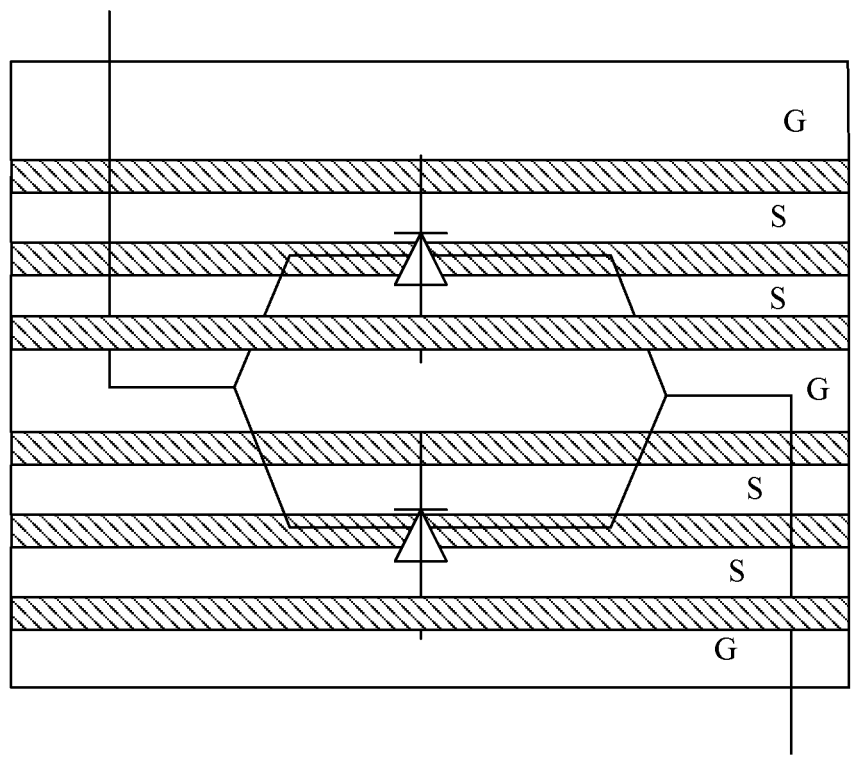
FIG. 13 is a schematic diagram of an electrode structure of a modulator according to an embodiment of this application.

FIG. 13 is a schematic diagram of an electrode structure of a modulator according to an embodiment of this application. It can be learned from FIG. 13 that the electrode structure of the modulator provided in this embodiment of this application is GSSGSSG. An electrode structure of a modulation arm of the modulator is GSSG.

It should be understood that in this application embodiment, an electrode structure of each of X modulator segments is not required to be the structure shown in FIG. 13, provided that at least one included modulator segment whose electrode structure is the same as that shown in FIG. 13.

It should be understood that in this embodiment of this application, the X modulator segments may include a modulator segment whose electrode structure is an electrode structure of a conventional modulator, and include at least one modulator segment whose electrode structure is shown in FIG. 13. In this case, X is greater than or equal to 2. The electrode structure of the conventional modulator is GSGSG, and an electrode structure of a modulation arm of the conventional modulator is GSG. Optionally, in some embodiments, a silicon non-etched area is reserved below the S electrode in at least one GSSGSSG electrode structure.

Figure 14:
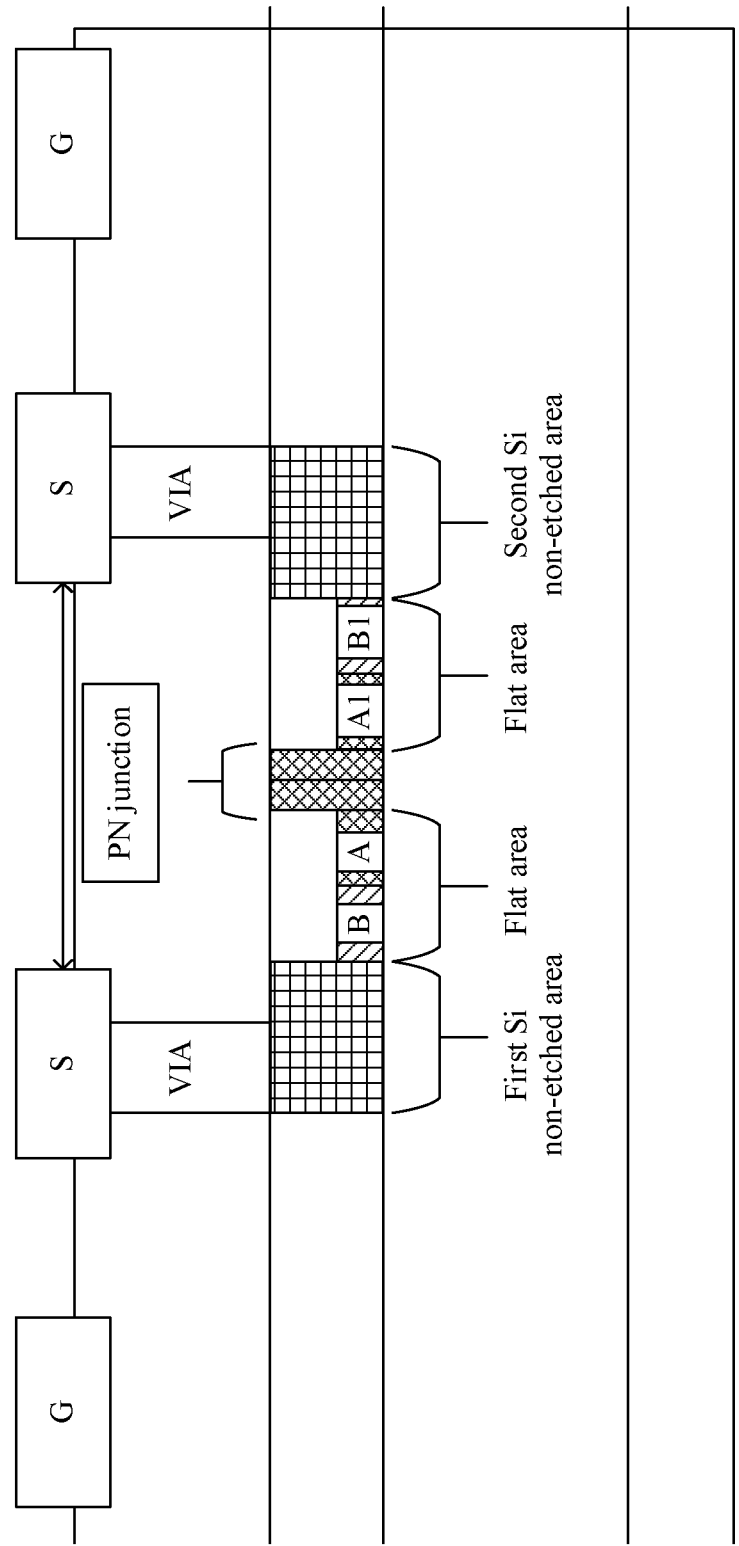
FIG. 14 is a schematic sectional view of an electrode structure of a modulation arm according to an embodiment of this application.

The following describes, with reference to FIG. 14, a difference between the S electrode of the modulator in the embodiments of this application and an S electrode of the conventional modulator.

Figure 15:
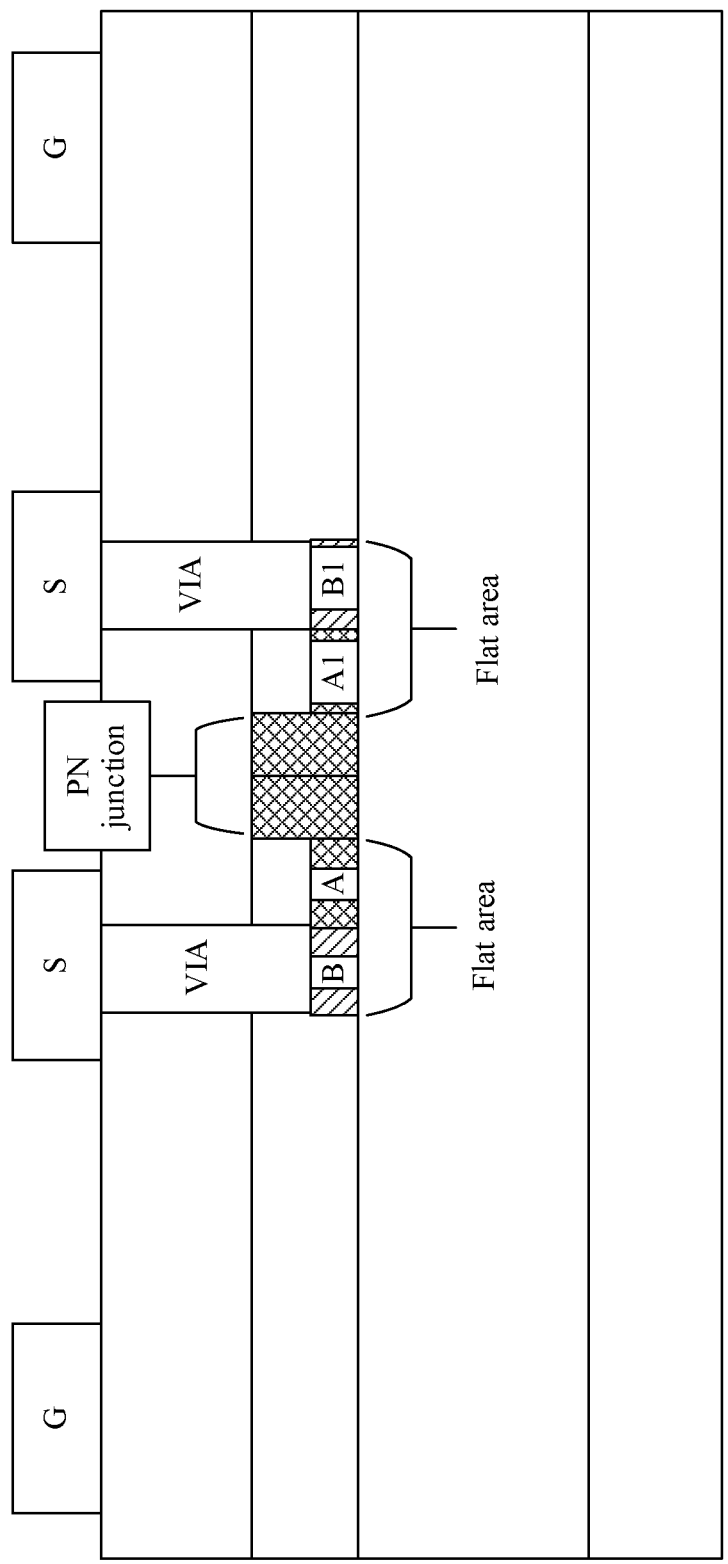
FIG. 15 is a schematic sectional view of an electrode structure of a conventional modulation arm.

FIG. 14 is a schematic sectional view of an electrode structure of a modulation arm according to an embodiment of this application. As shown in FIG. 14, on a structure of a PN junction of the modulator, a Si non-etched area is reserved below the S electrode. In a structure of a PN junction of the conventional modulator, a flat area is directly below the S electrode (as shown in FIG. 15). FIG. 15 is a schematic sectional view of an electrode structure of a conventional modulation arm.

A channel (VIA) in FIG. 14 is a channel through which an S electrode is connected to a PN junction structure. A first Si non-etched area may be a Si non-etched area of a P area or an N area, and a second Si non-etched area may also be a Si non-etched area of the P area or the N area. The flat area includes four areas A, B, A1, and B1. The PN junction may be shown in FIG. 14, or may include two areas A and A1, which are collectively referred to as a PN junction.

It can be learned from comparison between FIG. 14 and FIG. 15 that, compared with the electrode structure of the modulation arm of the modulator in the prior art, a difference of the electrode structure of the modulation arm of the modulator provided in the embodiments of this application lies in that one Si non-etched area is included under each S electrode.

In the sectional view of the electrode structure of the modulation arm shown in FIG. 14, a Si non-etched area is reserved below the S electrode, so that a series electrode connected to the PN junction can be reduced, thereby improving a modulation rate of the modulator. It should be understood that the novel electrode structure of the modulation arm provided in this application may also be referred to as a CPW electrode or another electrode.

In the sectional view of the electrode structure of the conventional modulation arm shown in FIG. 15, the electrode structure of the modulation arm is GSG, and is referred to as a coplanar waveguide (CPW) electrode.

Figure 16:
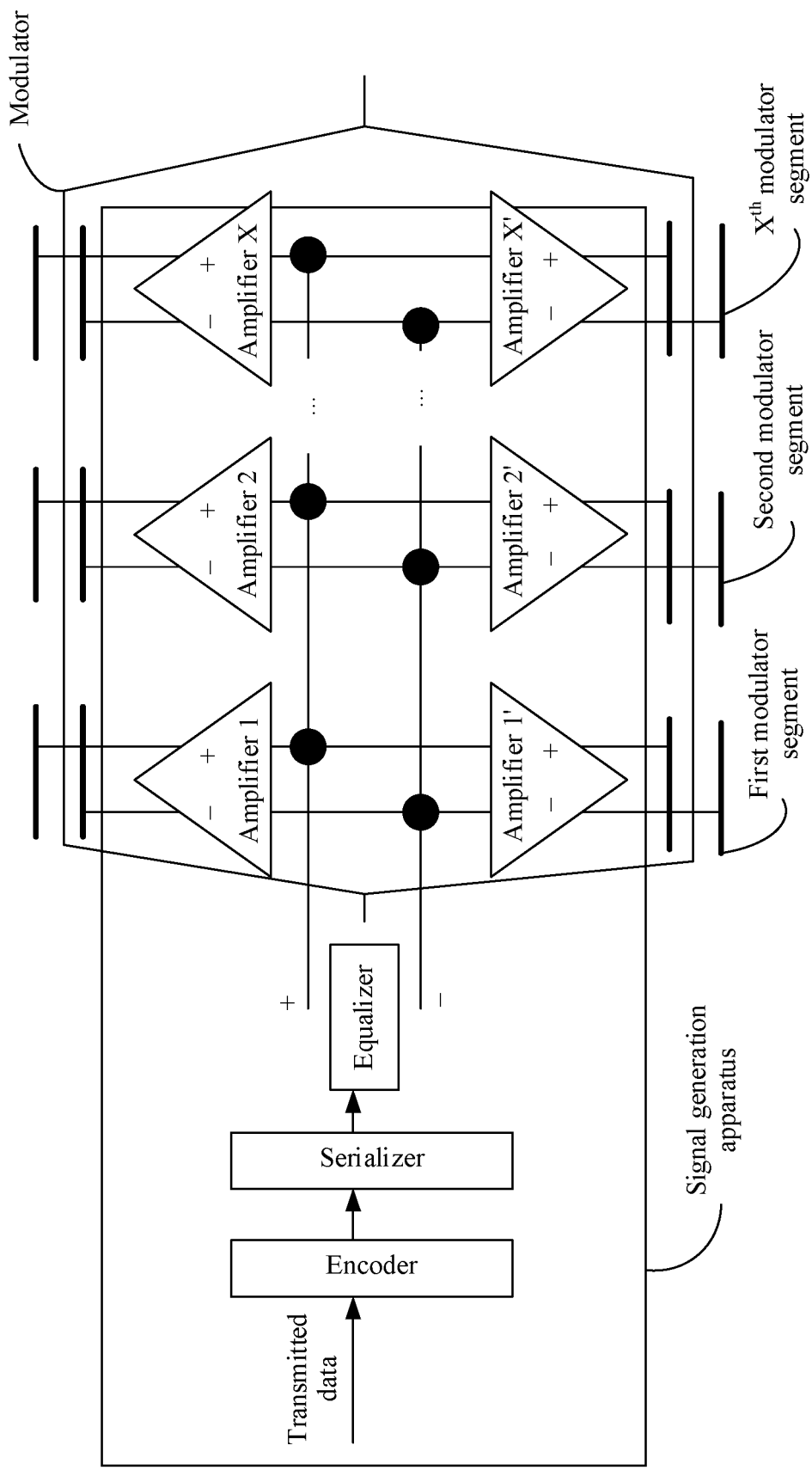
FIG. 16 is a schematic diagram of a drive apparatus according to an embodiment of this application.
Figure 17:
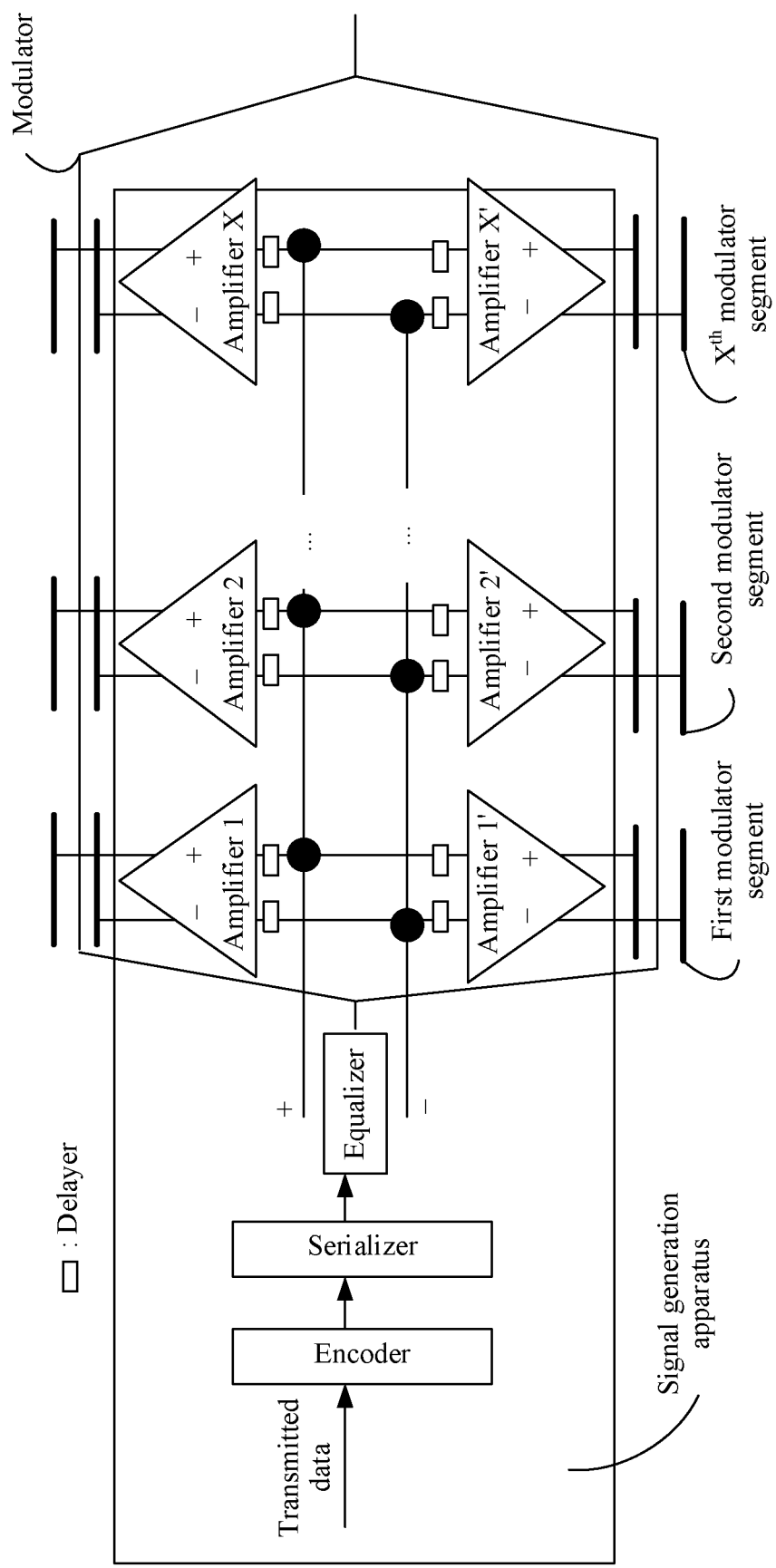
FIG. 17 is a schematic diagram of another drive apparatus according to an embodiment of this application.
Figure 18:
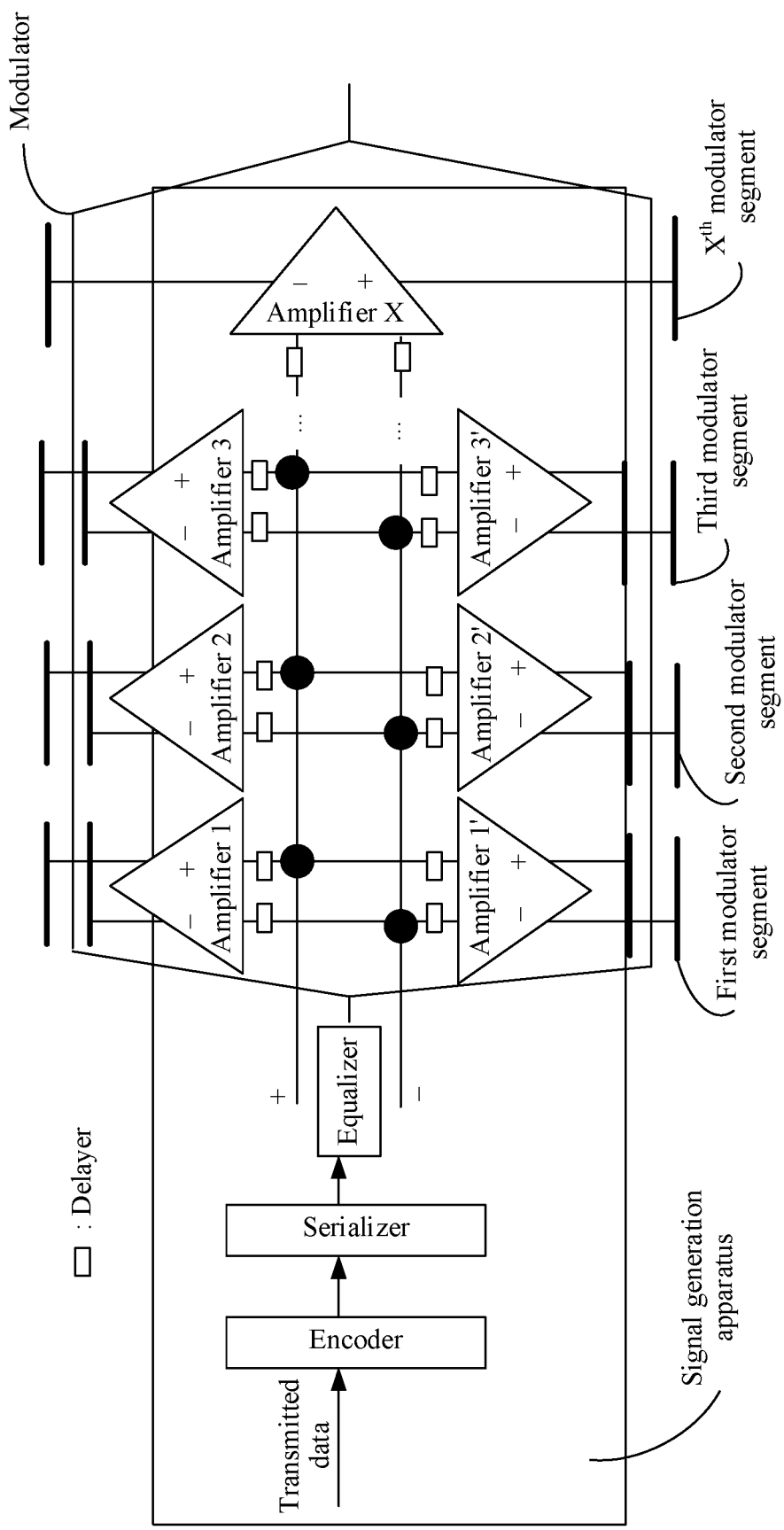
FIG. 18 is a schematic diagram of still another drive apparatus according to an embodiment of this application.

The following describes in detail the drive apparatus in the embodiments of this application with reference to FIG. 16 to FIG. 18.

FIG. 16 is a schematic diagram of a drive apparatus according to an embodiment of this application. The apparatus includes the signal generation apparatus described in FIG. 4 to FIG. 10, and the modulator described in FIG. 11 to FIG. 15. For the descriptions of the signal generation apparatus and the modulator, refer to the related accompanying drawings. Details are not described herein again.

It can be learned from FIG. 16 and FIG. 2 that in this application, N pairs of differential signals output by the signal generation apparatus are used to directly drive the X modulator segments of the modulator, and do not need to be amplified by a driver.

To be specific, on the transmitter side of the SerDes, an electrical signal sent by a transmitter directly drives the modulator, and the modulator converts the electrical signal into an optical signal, and transmits the optical signal to a destination optical signal input device through an optical signal transmission link.

It should be understood that, because the driver is removed, power consumption of the optical module is reduced, thereby supporting a multi-channel integration technology.

Further, to ensure that when the N pairs of differential signals output by the signal generation apparatus respectively drive the two modulation arms of the X modulator segments, a delay of the differential signals is consistent with a delay of an optical signal in two different modulator segments, a delayer is added to a signal input end of each amplifier, and a delay of each delayer meets a delay requirement of each amplifier. FIG. 17 is a schematic diagram of another drive apparatus according to an embodiment of this application.

Optionally, in this embodiment of this application, the X modulator segments may include a modulator segment whose two modulation arms are driven by one positive signal and one negative signal of one pair of differential signals, provided that it is ensured that two modulation arms of at least one of the X modulator segments are respectively driven by two pairs of differential signals. FIG. 18 is a schematic diagram of still another drive apparatus according to an embodiment of this application.

Figure 19:
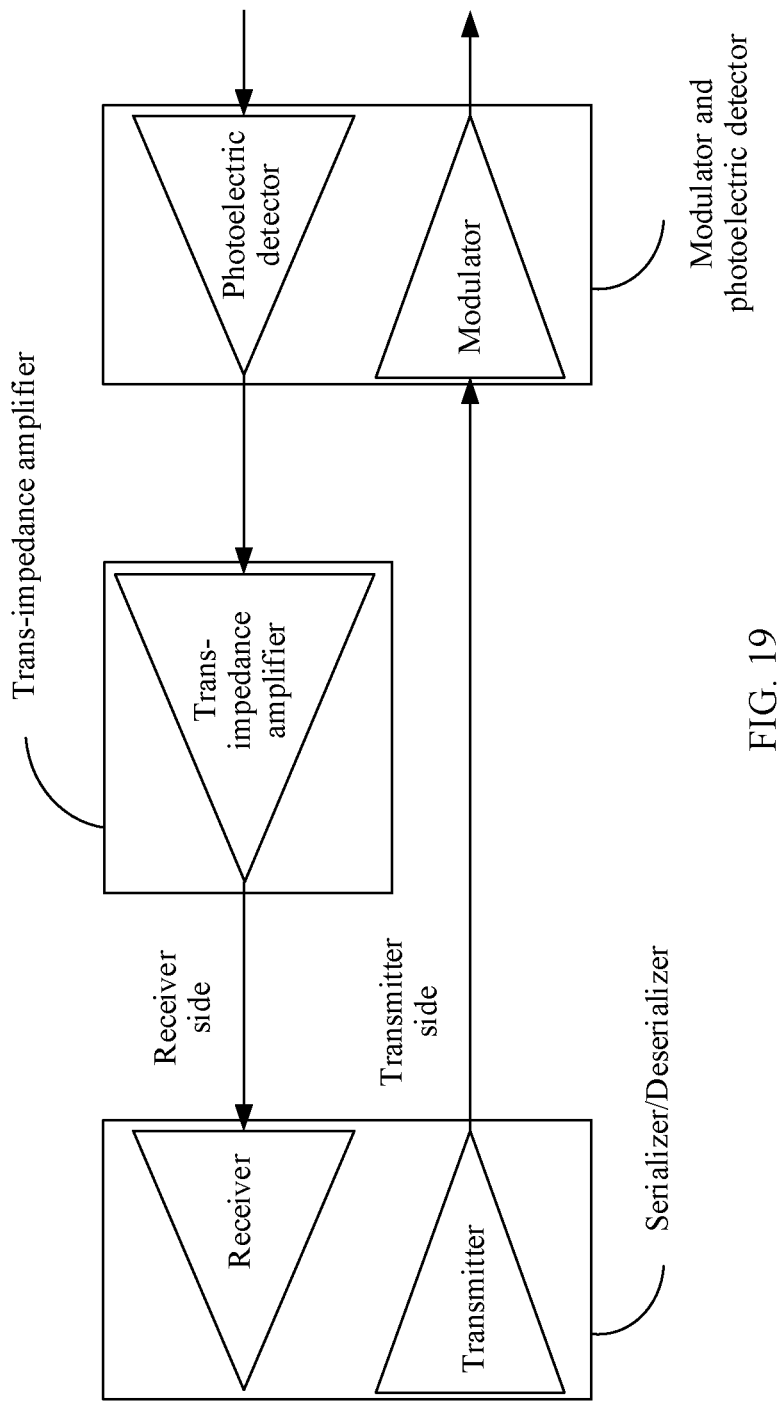
FIG. 19 is a schematic diagram of a structure of a system according to an embodiment of this application.

FIG. 19 is a schematic diagram of a structure of a system according to an embodiment of this application.

It can be learned from comparison between FIG. 1 and FIG. 19 that the system provided in this embodiment of this application includes the drive apparatus shown in any one of FIG. 16 to FIG. 18, and a signal receiving apparatus. The signal receiving apparatus includes a PD, a TIA, and a deserializer, and does not require a driver. The modulator is directly driven by the SerDes, so that power consumption of the apparatus can be reduced.

Optionally, in some embodiments, the foregoing system is an optical module. Optionally, the foregoing system is a combination of an optical module and a SerDes. In other words, compared with FIG. 1, the optical module provided in this embodiment of this application does not require the SerDes.

It should be understood that the quantity of amplifiers and the quantity of modulator segments that are shown in the foregoing figures are merely examples, and do not limit the protection scope of this application. In this application, the quantity of amplifiers only needs to be greater than or equal to two, and the quantity of modulator segments only needs to be greater than or equal to one.

Figure 20:
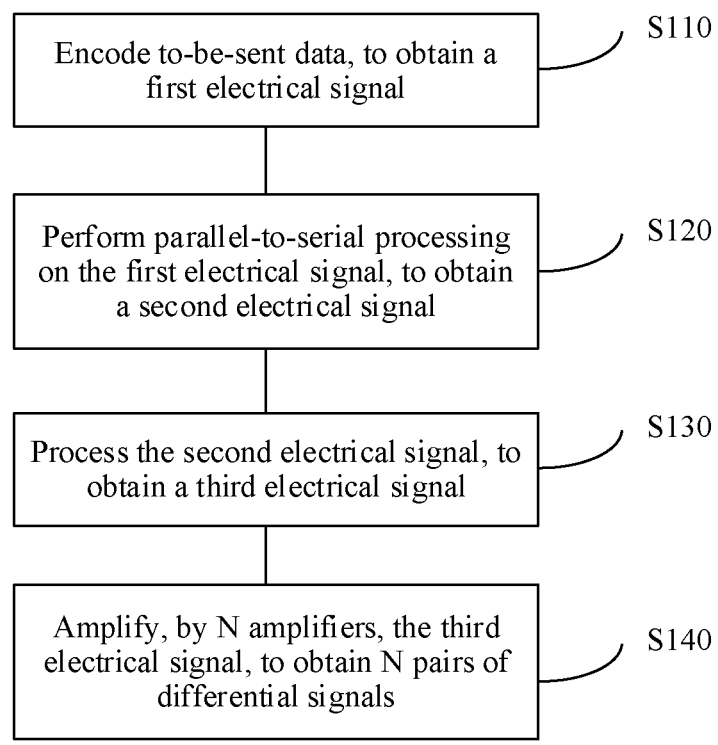
FIG. 20 is a schematic diagram of a signal generation method according to an embodiment of this application.

FIG. 20 is a flowchart of a signal generation method according to an embodiment of this application. The method includes the following steps.

S110: Encode to-be-sent data, to obtain a first electrical signal.

It should be understood that, in S110, the encoder in the SerDes may encode the to-be-sent data to obtain the first electrical signal, or S110 may be implemented by another component that can implement the encoding function.

S120: Perform parallel-to-serial processing on the first electrical signal, to obtain a second electrical signal.

It should be understood that, in S120, the serializer in the SerDes may process the first electrical signal to obtain the second electrical signal, or S120 may be implemented by another component that can implement the serial function.

S130: Process the second electrical signal, to obtain a third electrical signal.

It should be understood that, in S130, the equalizer in the SerDes may process a gain value of the second electrical signal to obtain the third electrical signal, or S130 may be implemented by another component that can implement the processing function.

S140: The third electrical signal is amplified by N amplifiers, to obtain N pairs of differential signals.

It should be understood that, in S140, the N amplifiers in the SerDes may amplify the third electrical signal to obtain the N pairs of differential signals, or S140 may be implemented by another component that can implement the amplification function.

Optionally, in some embodiments, the signal generation method further includes: performing delay processing on a first pair of differential signals by using a delayer, where the delayer is disposed at a signal input end of a first amplifier and/or a signal output end of the first amplifier, the first pair of differential signals are differential signals output by the first amplifier, and the first amplifier is any one of the N amplifiers.

A delay of the delayer is $(M-1)*t$, where M indicates an $M^{th}$ modulator segment in X modulator segments driven by the first pair of differential signals, X is an integer greater than 1, M is a positive integer less than or equal to X, and t is a preset unit delay.

Further, the N pairs of differential signals drive modulation arms of the X modulator segments, and two modulation arms of at least one of the X modulator segments are driven by two pairs of differential signals, where X is a positive integer greater than 1.

An electrode structure of the modulation arm includes an electrode structure of GSSG; and an electrode structure of at least one of the X modulator segments is GSSGSSG.

Optionally, a silicon non-etched area is reserved below the S electrode in at least one GSSG electrode structure.

It may be clearly understood by a person skilled in the art that, for the purpose of convenient and brief description, for a unit for performing each step in the signal generation method shown in FIG. 20, refer to the description of the corresponding functional unit in the foregoing apparatus embodiment. Details are not described herein again.

In the several embodiments provided in this application, it should be understood that the disclosed system, apparatus, and method may be implemented in other manners. For example, the apparatus embodiment described above is merely an example. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one place, or may be distributed on a plurality of integrated circuits. Some or all of the units may be selected based on actual requirements to achieve the objectives of the solutions of the embodiments. In addition, functional units in the embodiments of this application may be integrated into one integrated circuit, or each of the units may exist alone physically, or two or more units are integrated into one unit.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A signal generation apparatus, comprising:
an encoder, a serializer, an equalizer, and N amplifiers, wherein
the encoder is configured to encode to-be-sent data, to obtain a first electrical signal;
the serializer is configured to perform parallel-to-serial processing on the first electrical signal, to obtain a second electrical signal;
the equalizer is configured to process the second electrical signal, to obtain a third electrical signal; and
the third electrical signal is amplified by the N amplifiers, to obtain N pairs of differential signals, wherein N is an integer greater than 2.

2. The apparatus according to claim 1, wherein a delayer is disposed at a signal input end of a first amplifier and/or a signal output end of a first amplifier, the delayer is configured to control a delay of a first pair of differential signals output by the first amplifier, and the first amplifier is any one of the N amplifiers.

3. The apparatus according to claim 2, wherein a delay of the delayer is $(M-1)*t$, wherein M indicates the $M^{th}$ modulator segment in X modulator segments driven by the first pair of differential signals, X is an integer greater than 1, M is a positive integer less than or equal to X, and t is a preset unit delay.

4. A modulator, comprising X modulator segments, wherein each modulator segment comprises two modulation arms, and the modulation arms are driven by the N pairs of differential signals generated according to claim 1.

5. The modulator according to claim 4, wherein a delayer is disposed at a signal input end of a first amplifier and/or a signal output end of the first amplifier, the delayer is configured to control a delay of a first pair of differential signals output by the first amplifier, and the first amplifier is any one of the N amplifiers.

6. The modulator according to claim 5, wherein a delay of the delayer is $(M-1)*t$, wherein M indicates the $M^{th}$ modulator segment in X modulator segments driven by the first pair of differential signals, X is an integer greater than 1, M is a positive integer less than or equal to X, and t is a preset unit delay.

7. The modulator according to claim 4, wherein an electrode structure of the modulation arm comprises GSSG electrode structure; and an electrode structure of at least one of the X modulator segments is GSSGSSG.

8. The modulator according to claim 7, wherein a silicon non-etched area is reserved below an S electrode in at least one GSSG electrode structure.

9. A drive apparatus, comprising:
a signal generation apparatus and a modulator-, wherein the signal generation apparatus, comprises:
an encoder, a serializer, an equalizer, and N amplifiers, wherein
the encoder is configured to encode to-be-sent data to obtain a first electrical signal; the serializer is configured to perform parallel-to-serial processing on the first electrical signal to obtain a second electrical signal; the equalizer is configured to process the second electrical signal, to obtain a third electrical signal; and the third electrical signal is amplified by the N amplifiers, to obtain N pairs of differential signals, wherein N is an integer greater than 2; and
the modulator comprises X modulator segments, wherein each modulator segment comprises two modulation arms, and the modulation arms are driven by the N pairs of differential signals.

10. The drive apparatus according to claim 9, wherein a delayer is disposed at a signal input end of a first amplifier and/or a signal output end of the first amplifier, the delayer is configured to control a delay of a first pair of differential signals output by the first amplifier, and the first amplifier is any one of the N amplifiers.

11. The drive apparatus according to claim 10, wherein a delay of the delayer is $(M-1)*t$, wherein M indicates the $M^{th}$ modulator segment in X modulator segments driven by the first pair of differential signals, X is an integer greater than 1, M is a positive integer less than or equal to X, and t is a preset unit delay.

12. A system, comprising:
the drive apparatus according to claim 9 and a signal receiving apparatus, wherein the signal receiving apparatus comprises a photoelectric detector (PD), a transimpedance amplifier (TIA), and a deserializer.

13. A signal generation method, comprising:
encoding to-be-sent data to obtain a first electrical signal;
performing parallel-to-serial processing on the first electrical signal to obtain a second electrical signal;
processing the second electrical signal; to obtain a third electrical signal; and
amplifying, by N amplifiers, the third electrical signal; to obtain N pairs of differential signals, wherein N is an integer greater than 2.

14. The method according to claim 13, wherein the method further comprises: performing delay processing on a first pair of differential signals by using a delayer, wherein the delayer is disposed at a signal input end of a first amplifier and/or a signal output end of the first amplifier, the first pair of differential signals are differential signals output by the first amplifier, and the first amplifier is any one of the N amplifiers.

15. The method according to claim 14, wherein a delay of the delayer is (M-1)*t, wherein M indicates the $M^{th}$ modulator segment in X modulator segments driven by the first pair of differential signals, X is an integer greater than 1, M is a positive integer less than or equal to X, and t is a preset unit delay.

16. The method according to claim 13, wherein the N pairs of differential signals drive modulation arms of the X modulator segments, and two modulation arms of at least one of the X modulator segments are driven by two pairs of differential signals, wherein X is an integer greater than 1.

17. The method according to claim 16, wherein an electrode structure of the modulation arm comprises a GSSG electrode structure; and an electrode structure of at least one of the X modulator segments is GSSGSSG.

18. The method according to claim 17, wherein a silicon non-etched area is reserved below an S electrode in at least one GSSG electrode structure.

\* \* \* \* \*

UNITED STATES PATENT AND TRADEMARK OFFICE
CERTIFICATE OF CORRECTION

PATENT NO. : 11,165,609 B2
APPLICATION NO. : 17/144217
DATED : November 2, 2021
INVENTOR(S) : Lei Gao et al.

It is certified that error appears in the above-identified patent and that said Letters Patent is hereby corrected as shown below:

In the Claims

In Column 18, Line 16, in Claim 7, delete "comprises" and insert -- comprises a --.

In Column 18, Line 23, in Claim 9, delete "modulator-," and insert -- modulator, --.

In Column 18, Line 49, in Claim 11, delete "Xis" and insert -- X is --.

In Column 18, Line 61, in Claim 13, delete "signal;" and insert -- signal --.

In Column 18, Line 63, in Claim 13, delete "signal;" and insert -- signal --.

Signed and Sealed this
Twenty-first Day of June, 2022

Katherine Kelly Vidal
*Director of the United States Patent and Trademark Office*